United States Patent
Pinkerton et al.

(10) Patent No.: US 7,256,063 B2
(45) Date of Patent: Aug. 14, 2007

(54) NANOELECTROMECHANICAL TRANSISTORS AND SWITCH SYSTEMS

(75) Inventors: Joseph F. Pinkerton, Austin, TX (US); John C. Harlan, Leander, TX (US); Jeffrey D. Mullen, Scarsdale, NY (US)

(73) Assignee: Ambient Systems, Inc., Austin, TX (US)

( * ) Notice: Subject to any disclaimer, the term of this patent is extended or adjusted under 35 U.S.C. 154(b) by 0 days.

(21) Appl. No.: 10/886,648

(22) Filed: Jul. 7, 2004

(65) Prior Publication Data

US 2005/0104085 A1    May 19, 2005

Related U.S. Application Data

(62) Division of application No. 10/453,783, filed on Jun. 2, 2003.

(51) Int. Cl.
*H01L 21/00* (2006.01)
(52) U.S. Cl. .......................................... 438/53; 977/732
(58) Field of Classification Search ................ 257/107, 257/393, 444; 977/724, 732
See application file for complete search history.

(56) References Cited

U.S. PATENT DOCUMENTS

| | | |
|---|---|---|
| 2,979,551 A | 4/1961 | Pack |
| 3,181,365 A | 5/1965 | Maninger |
| 3,252,013 A | 5/1966 | Stanton |
| 3,365,653 A | 1/1968 | Gabor et al. |

(Continued)

FOREIGN PATENT DOCUMENTS

DE    101 23 876    11/2002

(Continued)

OTHER PUBLICATIONS

Rueckes et al., "Carbon nanotube-based nonvolatile random access memory for molecular computing," Science, vol. 289 (Jul. 7, 2000), pp. 94-97.

(Continued)

*Primary Examiner*—Nathan W. Ha
*Assistant Examiner*—Mursalin B. Hafiz
(74) *Attorney, Agent, or Firm*—Fish & Neave IP Group of Ropes & Gray LLP; Robert W. Morris; Jeffrey D. Mullen

(57) ABSTRACT

Nanoelectromechanical switch systems (NEMSS) that are structured around the mechanical manipulation of nanotubes are provided. Such NEMSS can realize the functionality of, for example, automatic switches, adjustable diodes, amplifiers, inverters, variable resistors, pulse position modulators (PPMs), and transistors.

In one embodiment, a nanotube is anchored at one end to a base member. The nanotube is also coupled to a voltage source. This voltage source creates an electric charge at the tip of the free-moving-end of the nanotube that is representative of the polarity and intensity of the voltage source. The free-moving end of this nanotube can be electrically controlled by applying an electric charge to a nearby charge member layer that is either of the same (repelling) or opposite (attracting) polarity of the nanotube. A contact layer is then placed in the proximity of the free-moving end of the nanotube such that when a particular electric charge is placed on the nanotube, the nanotube electrically couples the contact layer.

19 Claims, 12 Drawing Sheets

U.S. PATENT DOCUMENTS

| | | |
|---|---|---|
| 3,495,101 A | 2/1970 | Slonneger |
| 3,500,451 A | 3/1970 | Stephen |
| 3,508,089 A | 4/1970 | Cheshire |
| 3,609,593 A | 9/1971 | Boil et al. |
| 4,152,537 A | 5/1979 | Hansch |
| 4,387,318 A | 6/1983 | Kolm et al. |
| 4,536,674 A | 8/1985 | Schmidt |
| 4,595,864 A | 6/1986 | Stiefelmeyer et al. |
| 4,814,657 A | 3/1989 | Yano et al. |
| 4,966,649 A | 10/1990 | Harada et al. |
| 5,065,085 A | 11/1991 | Aspden et al. |
| 5,132,934 A | 7/1992 | Quate et al. |
| 5,216,631 A | 6/1993 | Sliwa, Jr. |
| 5,578,976 A | 11/1996 | Yao |
| 5,619,061 A | 4/1997 | Goldsmith et al. |
| 5,621,258 A | 4/1997 | Stevenson |
| 5,638,946 A | 6/1997 | Zavracky |
| 5,649,454 A | 7/1997 | Midha et al. |
| 5,677,823 A | 10/1997 | Smith |
| 5,768,192 A | 6/1998 | Eitan |
| 5,780,727 A | 7/1998 | Gimzewski et al. |
| 5,835,477 A | 11/1998 | Binnig et al. |
| 5,964,242 A | 10/1999 | Slocum |
| 6,011,725 A | 1/2000 | Eitan |
| 6,054,745 A | 4/2000 | Nakos et al. |
| 6,069,540 A | 5/2000 | Berenz et al. |
| 6,073,484 A | 6/2000 | Miller et al. |
| 6,114,620 A | 9/2000 | Zuppero et al. |
| 6,123,819 A | 9/2000 | Peeters |
| 6,127,744 A | 10/2000 | Streeter et al. |
| 6,127,765 A | 10/2000 | Fushinobu |
| 6,157,042 A | 12/2000 | Dodd |
| 6,160,230 A * | 12/2000 | McMillan et al. ......... 200/181 |
| 6,256,757 B1 | 7/2001 | Arkin |
| 6,261,469 B1 | 7/2001 | Zakhidov et al. |
| 6,300,756 B2 * | 10/2001 | Sturm et al. ............... 324/109 |
| 6,327,909 B1 | 12/2001 | Hung et al. |
| 6,424,079 B1 | 7/2002 | Carroll |
| 6,433,543 B1 | 8/2002 | Shahinpoor et al. |
| 6,445,006 B1 | 9/2002 | Brandes et al. |
| 6,445,109 B2 | 9/2002 | Per.cedilla.in et al. |
| 6,509,605 B1 * | 1/2003 | Smith ......................... 257/316 |
| 6,515,339 B2 | 2/2003 | Shin et al. |
| 6,528,785 B1 | 3/2003 | Nakayama et al. |
| 6,548,841 B2 | 4/2003 | Frazier et al. |
| 6,559,550 B2 | 5/2003 | Herman |
| 6,574,130 B2 | 6/2003 | Segal et al. |
| 6,593,666 B1 | 7/2003 | Pinkerton |
| 6,593,731 B1 | 7/2003 | Roukes et al. |
| 6,597,048 B1 | 7/2003 | Kan |
| 6,611,033 B2 | 8/2003 | Hsu et al. |
| 6,643,165 B2 | 11/2003 | Segal et al. |
| 6,653,547 B2 | 11/2003 | Akamatsu |
| 6,669,256 B2 | 12/2003 | Nakayama et al. |
| 6,672,925 B2 | 1/2004 | Talin et al. |
| 6,674,932 B1 | 1/2004 | Zhang et al. |
| 6,685,810 B2 | 2/2004 | Noca et al. |
| 6,708,491 B1 | 3/2004 | Weaver et al. |
| 6,730,370 B1 | 5/2004 | Olafsson |
| 6,756,795 B2 | 6/2004 | Hunt et al. |
| 6,762,116 B1 | 7/2004 | Skidmore |
| 6,774,533 B2 | 8/2004 | Fujita et al. |
| 6,803,840 B2 | 10/2004 | Kowalcyk et al. |
| 6,805,390 B2 | 10/2004 | Nakayama et al. |
| 6,806,624 B2 | 10/2004 | Lee et al. |
| 6,828,800 B2 | 12/2004 | Reich et al. |
| 6,846,682 B2 | 1/2005 | Heath et al. |
| 6,848,320 B2 | 2/2005 | Miyajima et al. |
| 6,882,051 B2 | 4/2005 | Majumdar et al. |
| 6,905,655 B2 | 6/2005 | Gabriel et al. |
| 6,911,682 B2 * | 6/2005 | Rueckes et al. ............ 257/202 |
| 6,914,329 B1 | 7/2005 | Lee et al. |
| 6,953,977 B2 | 10/2005 | Mlcak et al. |
| 7,071,023 B2 | 7/2006 | Bertin et al. |
| 7,095,645 B2 | 8/2006 | Pinkerton et al. |
| 2002/0024099 A1 | 2/2002 | Wantanabe et al. |
| 2002/0039620 A1 | 4/2002 | Shahinpoor et al. |
| 2002/0043895 A1 | 4/2002 | Richards et al. |
| 2002/0167374 A1 | 11/2002 | Hunt et al. |
| 2002/0175408 A1 | 11/2002 | Majumdar et al. |
| 2002/0180306 A1 | 12/2002 | Hunt et al. |
| 2003/0033876 A1 | 2/2003 | Roukes et al. |
| 2003/0036332 A1 | 2/2003 | Talin |
| 2003/0172726 A1 | 9/2003 | Yasutake et al. |
| 2003/0175161 A1 | 9/2003 | Gabriel et al. |
| 2004/0157304 A1 | 8/2004 | Guo |
| 2004/0239210 A1 | 12/2004 | Pinkerton et al. |
| 2004/0240252 A1 | 12/2004 | Pinkerton et al. |
| 2005/0104085 A1 | 5/2005 | Pinkerton et al. |
| 2005/0179339 A1 | 8/2005 | Pinkerton et al. |
| 2005/0258717 A1 | 11/2005 | Mullen |

FOREIGN PATENT DOCUMENTS

| | | |
|---|---|---|
| EP | 0518283 | 12/1992 |
| EP | 09977345 | 2/2000 |
| JP | 02004516 | 1/1990 |
| WO | WO 01/03208 | 1/2001 |
| WO | WO 01/20760 | 3/2001 |
| WO | WO 01/93343 | 12/2001 |
| WO | WO 02/080360 | 10/2002 |
| WO | WO 03/001657 | 1/2003 |
| WO | WO 03/021613 | 3/2003 |
| WO | WO03/078305 A1 * | 9/2003 |

OTHER PUBLICATIONS

Halg, Beat, "On a micro-electro-mechanical nonvolatile memory cell," IEEE Trans., Electron Devices, vol. 37, No. 10 (Oct. 1990) pp. 2230-2236.

White D R et al., "The status of Johnson Noise Thermometry," Metrologia Bur. Int. Poids & measures, France, vol. 33, 1996, pp. 325-335.

Dequesnes M et al., "Calculation of pull-in voltages for carbon-nanotube-based nanoelectromechanical switches," nanotechnology IOP publishing UK, vol. 13, Jan. 22, 2002, pp. 120-131.

Baughman et al. "Carbon Nanotube Actuators," Science American Association for the Advancement of Science, U.S., vol. 284, May 21, 1999, pp. 1340-1344.

Halliday et al.; "Physica. Third Edition"; John Wiley & Sons, Inc.; 1978; pp. 529-531.

Kinaret J.M., et al. "A Carbon-Nanotube-Based Nanorelay", Applied Physics Letters, American Institute of Physics, New York, USA, vol. 8, No. 8, pp. 1287-1289.

Sung et al. "Well-aligned carbon nitride nanotubes synthesized in ariodic alumina by electron cyclotron resonance chemical vapor deposition," Applied Physics Letters, vol. 74, No. 2, pp. 197-199, Jan. 11, 1999.

Database Inspec Online!, Institute of Electrical Engineers, Stevenage, GB; Ponomarenko et al. "Properties of Boron carbon nanotubes: density-functional-based tight-binding calculations," Database accession No. 7588110, XP002278946, abstract Physical Review B (Condensed Matter and material Physics), vol. 67, No. 12, pp. 125401-1-5, Mar. 15, 2003.

Baughman et al., "Carbon Nanotubes Actuators," Science, May 21, 1999, Issue 5418, vol. 284, pp. 1240-1344.

Cleland et al., "Fabrication of High Frequency Nanometer Scale Mechanical Resonators from Bulk Si Crystals," Appl. Phys. Lett. 69(18), Oct. 28, 1996.

Dresselhaus et al.; "Carbon Nanotubes: Synthesis, Structure, Properties, and Applications"; Springer-Verlag Berlin Heidelberg 2001; pp. 198-199, 292-293.

* cited by examiner

NANOELECTROMECHANICAL TRANSISTORS AND SWITCH SYSTEMS

CROSS REFERENCE TO RELATED APPLICATION

This is a divisional of copending, commonly-assigned, U.S. patent application Ser. No. 10/453,783 filed Jun. 2, 2003.

BACKGROUND OF THE INVENTION

The present invention relates to nanoelectromechanical (NEM) switch systems and transistors. In particular, the present invention relates to NEMSS that can be utilized as traditional electrical components such as, for example, transistors, amplifiers, adjustable diodes, inverters, memory cells, pulse position modulators (PPMs), variable resistors, and switching systems.

As designs for metal-oxide semiconductor field effect transistors (MOSFETs) become more compact and approach the minimum theoretical sizing limitations for a MOSFET, the need for technologies that can produce smaller transistor structures becomes apparent. It is therefore desirable to fabricate a transistor that can be sized smaller than a transistor fabricated at the minimum theoretical size of a MOSFET. By decreasing a transistor's size, the number of transistors that may be placed on an integrated circuit increases. As a result, circuit complexity increases, speed increases, and the circuit's operating power decreases.

Microelectromechanical systems (MEMS) and NEMSS that are structured around nanotubes have been developed. Such systems are described, for example, in commonly assigned copending U.S. patent application Ser. No. 09/885,367 to Pinkerton that was filed on Jun. 20, 2001. Looking at FIG. 11 of this application, a novel power generator that utilizes a nanotube immersed in a working fluid to generate electrical power from the kinetic and thermal characteristics of a working substance is illustrated. As shown by the application, nanotubes can be fabricated at extremely small sizes (e.g., 1 nanometer) and their characteristics (e.g., elasticity and conductivity) may be utilized in many different ways. It is therefore desirable to realize nanotube-based transistors that can be fabricated to have sizing limitations roughly equivalent to the size of a single nanotube.

Sizing limitations are not the only limitations that affect the performance characteristics and utility of a traditional MOSFET. For example, traditional MOSFETs have minimum turn-ON voltages (e.g., 0.7 volts). Thus, miniscule voltage signals (e.g., 0.00001 volts) cannot be utilized to turn on conventional MOSFETs. Numerous applications exist in which there is a need for transistors with small turn-ON voltages. For example, applications in which faint signals, such as thermal or electromagnetic noise signals, need to be recognized would benefit from transistors with extremely low turn-ON. It is therefore desirable to realize a transistor structure with a very low turn-ON voltage.

Additionally, traditional MOSFETs exhibit linear output characteristics. More particularly, traditional MOSFETs may be configured to provide an output (e.g., emitter current) that is continuous and has a linear gain dependent upon an input (e.g., base current). Applications exist in which the need for devices that can convert continuous signals to digital signals is present such as in pulse position modulation. However, traditional pulse position modulators are currently bulky because they require circuits that contain multiple instances of traditional MOSFET transistors. It is therefore desirable to fabricate a single NEM transistor that can function as a pulse position modulator.

SUMMARY OF THE INVENTION

It is an object of the present invention to fabricate NEMSS which are based upon the manipulation of electrically conductive and mechanically flexible nanometer-scale beams such as, for example, nanotubes or nano-wires. These NEMSS can employed as, for example, transistors, amplifiers, variable resistors, adjustable diodes, inverters, memory cells, PPMs, and automatic switches.

In one embodiment of the present invention, a carbon nanotube is anchored at one end to an electrical contact. The opposite end of this nanotube, however, is unattached and free to move. By inflicting an electric field on the nanotube when it carries an electric charge, the position and oscillation of the free-moving end of the nanotube can be controlled (e.g., by either repelling or attracting the nanotube).

Manipulating the location of the free-moving end of such a nanotube can be utilized to realize many electrical components. For example, a transistor may be realized by configuring the nanotube such that when an appropriate electric field is applied to the nanotube (e.g., a minimum base or gate threshold voltage), the free moving end of the nanotube couples to an electrical contact (e.g., an emitter or drain terminal). Thus, if the anchored end of the nanotube is also coupled to an electrical contact (e.g., collector or source terminal) current may flow through the nanotube when the threshold voltage is met.

Appropriate magnetic fields may also be applied to a partially anchored nanotube of the present invention. In doing so, the free-moving end of the nanotube may be held in contact, as a result of the magnetic field, with an electrical contact (e.g., emitter or drain contact) when current is flowing through the nanotube. The basic structure of a NEM transistor of the present invention can also be configured, utilized, or adjusted to provide the functionality of, for example, amplifiers, adjustable diodes, inverters, memory cells, PPMs, and automatic switches.

Additionally, a nanotube-based NEM transistor of the present invention has a very low minimum turn-ON voltage. Thus, miniscule voltage signals such as, for example, Johnson noise signals, may be sensed and manipulated. By adjusting, for example, the charge, length, width, temperature, and elevation of a nanotube, a minimum turn-ON voltage may by included in a particular embodiment of the present invention.

Nanotube-based NEM transistors of the present invention can also function as pulse position modulators. More particularly, if a strong magnetic field is not applied to a NEM transistor of the present invention then the free-moving end of the nanotube will couple to an emitter terminal at a rate dependent upon the intensity of the electric field created by the base terminal in combination with the charge density of the nanotube. As the intensity of the electric field created by the base terminal increases, so does the number of contacts per unit of time that will occur between the nanotube and the emitter contact. Thus, a PPM can be realized such that any analog signal applied to the base terminal of a NEM transistor of the present invention is converted to a digital signal, representative of the original signal applied to the base terminal, at the collector terminal.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE DRAWINGS

Figure 1:
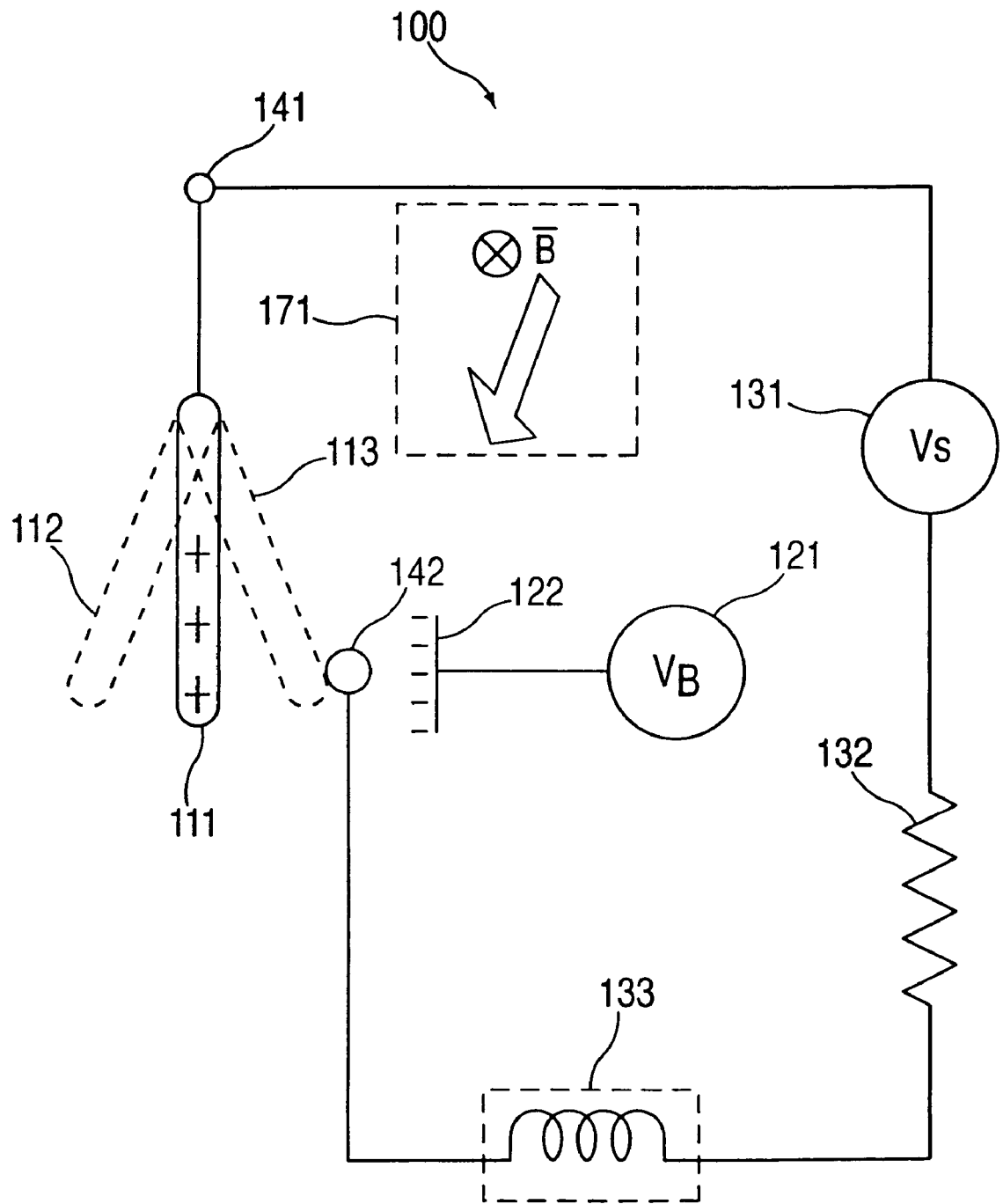
FIG. 1 is a circuit schematic of a nanometer-scale transistor constructed in accordance with the principles of the present invention.

Turning first to FIG. 1, NEM system 100 is illustrated. System 100 is defined by charge member layer 122 along with contacts 141, and 142. Generally, nanometer-scale beam 111 couples contact 141 to contact 142 dependent upon the signals supplied by charge member 122. More particularly, nanometer-scale beam 111 may mechanically bend and electrically couple to contact 142 at a rate dependent upon the voltages applied to contacts 141 and 121.

System 100 may be, for example, a transistor such that charge member 122 is the base terminal, contact 141 is the collector terminal, and contact 142 is the emitter terminal of the transistor. Additionally, the functionality of contact 142 as an emitter terminal may easily be interchanged with the functionality of contact 141 as a collector terminal. In this manner, contact 141 may be an emitter terminal of NEM system 100 while contact 142 may be a collector terminal of NEM system 100. Furthermore, the terms collector, emitter, and base terminals do not limit the functionality of a NEM transistor constructed in accordance with the principles of the present invention to model only the functionality of a bi-polar junction transistor (BJT). The collector, emitter and base terminals of NEM system 100 can also be utilized as source, drain, and gate terminals. Such terms are commonly used to model the functionality of a MOSFET. However, the terminals of a NEM transistor constructed in accordance with the principles of the present invention are not limited to a functionality appreciated by a BJT or MOSFET. In this manner, functionality not included in a BJT or MOSFET may be realized and employed by a NEM transistor constructed in accordance with the principles of the present invention. Such alternative functionality, and any modifications needed to realize such functionality, will become apparent by the detailed description that follows.

Particularly, nanometer-scale beam 111 preferably has either a positive or negative charge such that the signals supplied by charge member 122 either repels nanometer-scale beam 111 to position 112 or attracts nanometer-scale beam 111 to position 113. In those instances when nanometer-scale beam 111 is attracted to position 113 by attracting signals from charge member 122, nanometer-scale beam 111 electrically couples to contact 142.

In one preferred embodiment, nanometer-scale beam 111 is a positively charged nanotube that couples to contact 142 when the negative charge intensity of charge member 122 increases as a result of an increase in voltage to charge member 122. In such an embodiment, charge member 122 is a negatively charged dielectric located beneath contact 142 where a higher voltage supplied to charge member 122 results in a higher negative charge density. A more detailed description of a nanotube-based transistor is provided below with the description of transistor 300 of FIG. 3.

Persons skilled in the art will appreciate that nanometer-scale beam 111 may be a structure other than a carbon nanotube. In this manner, nanometer-scale beam 111 may be embodied by any nanometer-scale member that is mechanically flexible and electrically conductive. For example, nanometer-scale beam 111 may also be a nanometer-scale wire.

The amount of charge on charge member 122 may be controlled by, for example, an AC or DC voltage supply source 121. Additionally, contact 141 may be coupled to source voltage 131 such that a voltage is applied to nanometer-scale beam ill and a current flows across nanometer-scale beam 111 when nanometer-scale beam 111 closes (e.g., electrically couples with contact 142). To complete the circuit of NEMS system 100, resistor 132 is optionally included and separates contact 142 from source voltage 131.

Persons skilled in the art will appreciate that in preferred embodiments of NEM system 100, voltage source 121 creates an electric field at charge member 122 that mechanically manipulates nanometer-scale beam 111. The polarity and intensity of this electric field, along with the charge profile and polarity of nanometer-scale beam 111 can be adjusted to manipulate the functionality of NEMS system 100.

When no static charge is placed on base charge member 122 (e.g., there is no electric field near nanometer-scale beam 111), nanometer-scale beam 111 will preferably still vibrate at a mechanical frequency that is in the MHz range within positions 112 and 113 due to thermal vibrations. Occasionally, these vibrations will allow nanometer-scale beam 111 to touch contact 142 (e.g., once per hour). As introduced above, if a negative static charge is placed on charge member 122 and nanometer-scale beam 111, for example, gains a positive charge by voltage source 131, nanometer-scale beam 111 may connect to emitter contact 142 more frequently (e.g., once per millisecond).

However, if the voltage at contact 141 is positive then nanometer-scale beam 111 will take on a positive charge. If voltage 121 is also a positive voltage then nanotube 111 will rarely come into contact with contact 142 (e.g., once per year). In one embodiment, the signal applied to contact 142 may be averaged over a period of time such that an operational transistor is realized.

Depending on the application, it may be beneficial to hold nanometer-scale beam 111 in electrical contact with contact 142 such that the signal at contact 142 does not lose strength (e.g., the signal is not averaged). Thus, NEMS system 100 may be placed in a magnetic field such as magnetic field (⊗B) 171. Magnetic field 171 can be utilized to create a Lorentz force around nanometer-scale beam 111 such that nanometer-scale beam 111 will stay electrically coupled to contact 142 as long as current flows through nanometer-scale beam 111.

Persons skilled in the art will appreciate that voltage source 131 may be a thermally-induced voltage. For example, voltage source 131 may be the Johnson noise of resistor 132. Inductor 133 may also be included in NEMS system 100 and configured to be in a series connection with resistor 132. As a result, if current flowing through inductor 133 changes then inductor 133 may "fight" the current change by providing a back electromotive field voltage. In this manner, inductor 133 may be utilized to smooth out current pulses provided when nanometer-scale beam 111 electrically couples contact 142.

Additionally, multiple instances of NEMS system 100 may be placed in an array such as a common-base array constructed in a parallel configuration. An example of such an array is included in array 400 of FIG. 4. This array's output signal stability and strength increases as more nanotubes are included in the array because the number of contacts between a single nanometer-scale beam and contact 142 increases.

Persons skilled in the art will appreciate that temperature and thermal vibrations may be utilized in NEMS system 100. For example, if nanometer-scale beam 111 is a carbon nanotube (CNT) then the free-moving end of nanometer-scale beam 111 may oscillate at different frequencies depending upon its temperature. In this manner, NEMS system 100 may actually be controlled by a temperature in conjunction with an electric field. Similarly, NEMS system 100 may be utilized as a temperature sensing device by measuring the number of times that nanometer-scale beam 111 contacts emitter contact 142 per period of time. If only temperature was manipulating nanometer-scale beam 111, a large number of contacts per period preferably indicates that nanometer-scale beam 111 was subjected to a high temperature during that period. Thermal vibrations can also be utilized to allow NEMS system 100 to have a zero voltage minimum turn-ON voltage. For example, if zero voltage is present at voltage source 121 then nanometer-scale beam 111 will still occasionally electrically couple with contact 142 due to the thermal vibrations of NEMS system 100.

Similar to utilizing thermal characteristics of NEMS system 100, optical devices may also be advantageously employed. For example, charge member 122 and voltage source 121 may be replaced by a lens and/or a light source. By focusing or introducing light onto nanometer-scale beam 111 that bends nanometer-scale beam 111, the rate of contacts between nanometer-scale beam 111 and contact 142 may be altered. Once again, introducing magnetic field 171 to such a transistor allows nanometer-scale beam 111 to maintain contact with contact 142 while current is flowing through nanometer-scale beam 111. Thus, the contact rate of nanometer-scale beam 111 may be manipulated by a variety of means. As shown above, light and temperature are two conditions that may be utilized to control and manipulate the contact rate of nanometer-scale beam 111 with contact 142. Similarly, other conditions such as magnetic and electric fields may be applied to nanometer-scale beam 111 to affect this contact rate. Moreover, NEM system 100 may be employed as, for example, a temperature, light, magnetic field, or electric field sensor by determining the contact rate and associating it to a particular condition intensity. To isolate a particular condition (e.g., light) from another condition (e.g., temperature), additional sensors may be utilized to correct for the sensing of the unwanted condition.

Persons skilled in the art will appreciate that magnetic field 171 is not the only technique that can be employed to maintain contact between nanometer-scale beam 111 and contact 142. For example, Van Der Wall forces may be utilized in NEMS system 100 to create a temporary bond between nanometer-scale beam 111 and contact 142.

Temporary bonds that are created between nanometer-scale beam 111 and contact 142 may be broken by procedures other than stopping current flow through nanometer-scale beam 111. For example, a voltage of the same polarity as the charge of nanometer-scale beam 111 may be applied to charge member 122 to overcome any Lorentz forces created by magnetic field 171. Furthermore, magnetic field 171 may simply be turned off or adjusted. Preferably, the electric field originally applied near nanometer-scale beam 111, via charge member 122, that caused nanometer-scale beam 111 to electrically couple with contact 142 may simply be turned off (e.g., given a zero voltage) such that the natural spring force of nanometer-scale beam 111 (or the thermal vibrations of nanotube 111) overcomes the Lorentz force caused by magnetic field 171. If nanometer-scale beam 111 is employed as a nanotube then this nanotube could be filled with different materials in order to manipulate the properties of the nanotube. For example, carbon nanotubes will have a lowered electrical resistance when filled with alkali metals such as, for example, sodium, lithium, or potassium.

Figure 2:
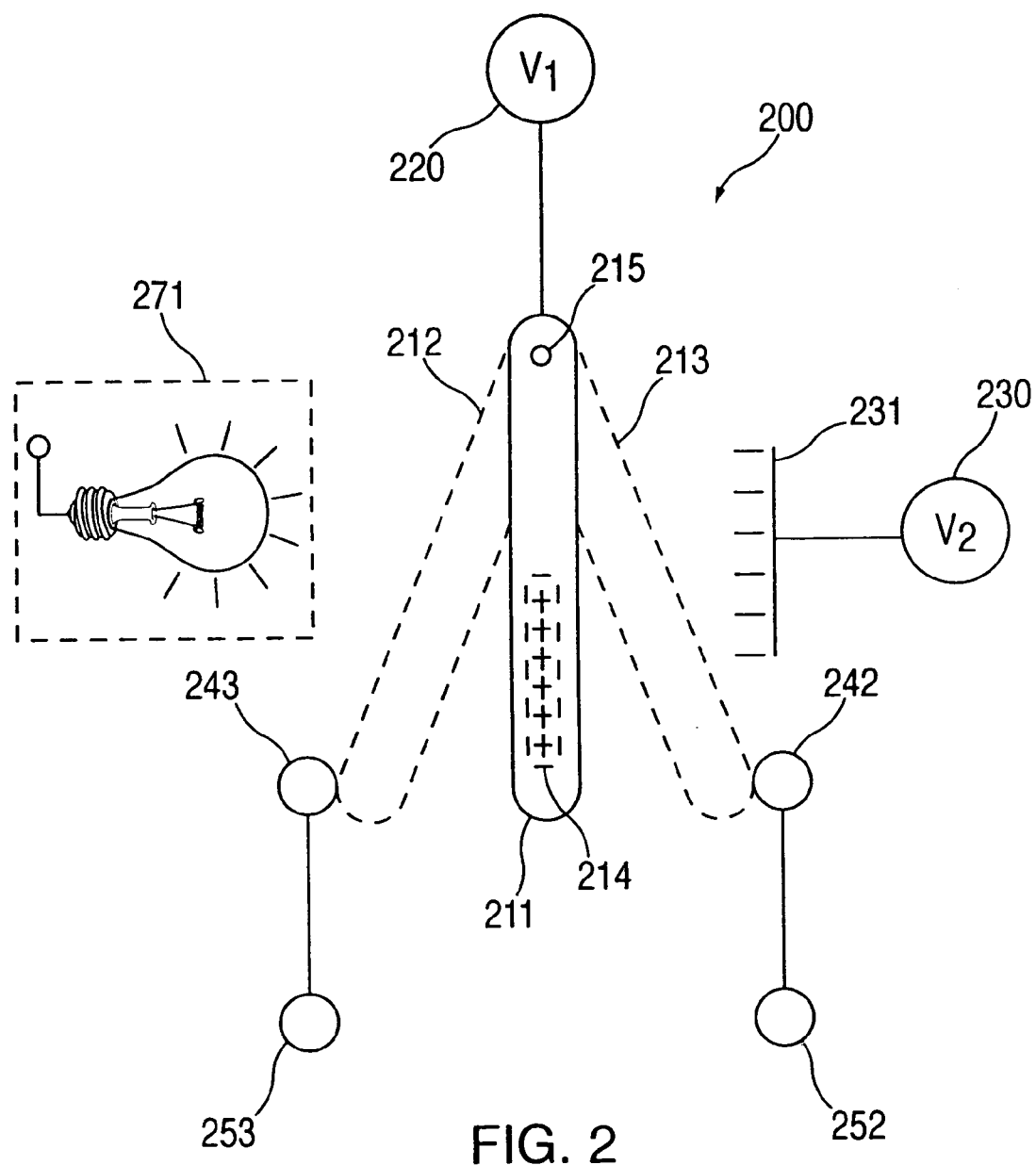
FIG. 2 is another circuit schematic of a nanometer-scale transistor constructed in accordance with the principles of the present invention.

FIG. 2 shows NEMS system 200 that includes nanometer-scale beam 211. Preferably, nanometer-scale beam 211 is both mechanically flexible and electrically conductive. Persons skilled in the art will appreciate that NEMS system 200 can be implemented on the micro-meter scale and, as a result, be configured as a microelectromechanical (MEM) system.

Nanometer-scale beam 211 may be, for example, a nanotube, nanometer-scale tube, group of bonded molecules, nano-wire, or an electrically conductive filament. As shown, nanometer-scale beam 211 is anchored at anchor point 215. Thus, anchor point 215 provides stability to one end of nanometer-scale beam 211 such that nanometer-scale beam 211 can flex between positions 212 and 213.

Preferably, mechanical stress is placed on nanometer-scale beam 211 as follows. Voltage source 220 is electrically coupled to nanotube 211 and can be, for example, either an AC or DC voltage signal. In this manner, electric charge 214 is applied to nanometer-scale beam 211 that is proportional to voltage source 220. Electrostatic forces can then introduce mechanical stress in nanometer-scale beam 211 and cause nanometer-scale beam 211 to flex. More particularly, if electric charge 231 is placed within the proximity of nanometer-scale beam 211 and electric charge 231 has the same polarity as electric charge 214 then nanometer-scale beam will preferably repel from electric charge 231. Similarly, if electric charge 231 is placed within the proximity of nanometer-scale beam 211 and electric charge 231 has a polarity that is opposite to the polarity of electric charge 214 then electrostatic forces will attract nanotube 211 to electric charge 231.

Electric charge 231 may be provided by voltage source 230 which may be, for example, an AC or DC voltage signal. Electrical contacts 243 and 242 may be placed within the region that nanometer-scale beam 211 can displace to. In this manner, voltage source 230 and voltage source 220 may influence the rate at which nanometer scale beam 211 electrically couples to electrical contacts 243 and 242.

Voltage source 230 (or voltage source 220) can also manipulate the frequency at which nanometer scale beam 211 contacts an electrical contact (e.g., electrical contacts 243 and/or 242). Output signals 253 and 252 may be obtained from contacts 243 and 242 respectively.

Light source 271 may be employed in NEMS system 200 to affect the contact rate between nanometer-scale beam 211 and an electrical contact (e.g., electrical contacts 243 and/or 242). As a result, NEMS system 200 may provide a system that converts light signals into electrical signals. Additionally, the contact rate between nanometer-scale beam 211 and an electrical contact will increase as the temperature of nanometer-scale beam 211 increases. In this manner, light source 271 may work in conjunction with a heat source. Even a low grade heat source (e.g., body heat) may be sufficient to provide a significant amount of heat to nanometer-scale beam 211. Thus, thermal motion of nanometer-scale beam 211 provides natural commutation events for a switch. The mechanical frequency of nanometer-scale beam 211 may be configured to be analogous to the switching frequency of a conventional switching circuit. Changing the intensity of the light/heat source, electric charge profile 214, mechanical attributes of nanometer-scale beam 211, or electric charge 231 will preferably change the switching characteristics.

Persons skilled in the art will appreciate that if a light source is included in NEMS system 200 then voltage source 230 does not have to be included in NEMS system 200. For example, voltage source 230 may be removed and replaced by light source 271. Input signals may then be applied as light signals. Depending on these signals, nanometer-scale beam 211 will switch differently with an electrical contact (e.g., electrical contacts 243 and/or 242). In this manner, output signals (e.g., output signals 253 and 252) of such an embodiment are representative of the input signals from light source 271. If voltage source 220 is large enough, then these output signals are not only electrical representations of the light signal but are also amplified signals.

Persons skilled in the art will also appreciate that voltage source 220 may be a relatively HIGH DC voltage source (e.g., approximately 1–5 volts) and voltage source 230 may be a relatively LOW input voltage signal (e.g. 1–5 microvolts). Conversely, voltage source 220 may be a relatively LOW input voltage signal while voltage source 230 is a relatively HIGH DC voltage source. In this manner, a weak input signal may be amplified such that an amplified signal is produced at, for example, electrical contacts 243 and 242.

Persons skilled in the art will appreciate that multiple instances of the NEMS system 200 may be arrayed together. For example, a billion such systems may be arrayed, in parallel, within a square centimeter. If each nanometer-scale beam is 1000 ohms then the minimum ON resistance (ignoring the resistance between the nanometer-scale beam and contacts 242 and/or 243) would be roughly 1 microohm. Thus, the resistive losses when conducting 1000 amperes of current would be a single watt (a conventional state-of-the-art insulated gate bipolar transistor would dissipate at least hundreds of watts when conducting 1000 amperes of current). As a result, the above array could be employed in high power applications. Turning on half of such switches would double the resistance while turning ON a quarter of the switches would increase the resistance by a factor of four (and so on). Thus, the array could be implemented as a variable resistor that is nearly perfectly linear and adjustable in, as introduced above, a billion steps. The speed of such an array would also beneficially be able to turn ON and OFF in mere fractions of a micro-second.

Figure 3:
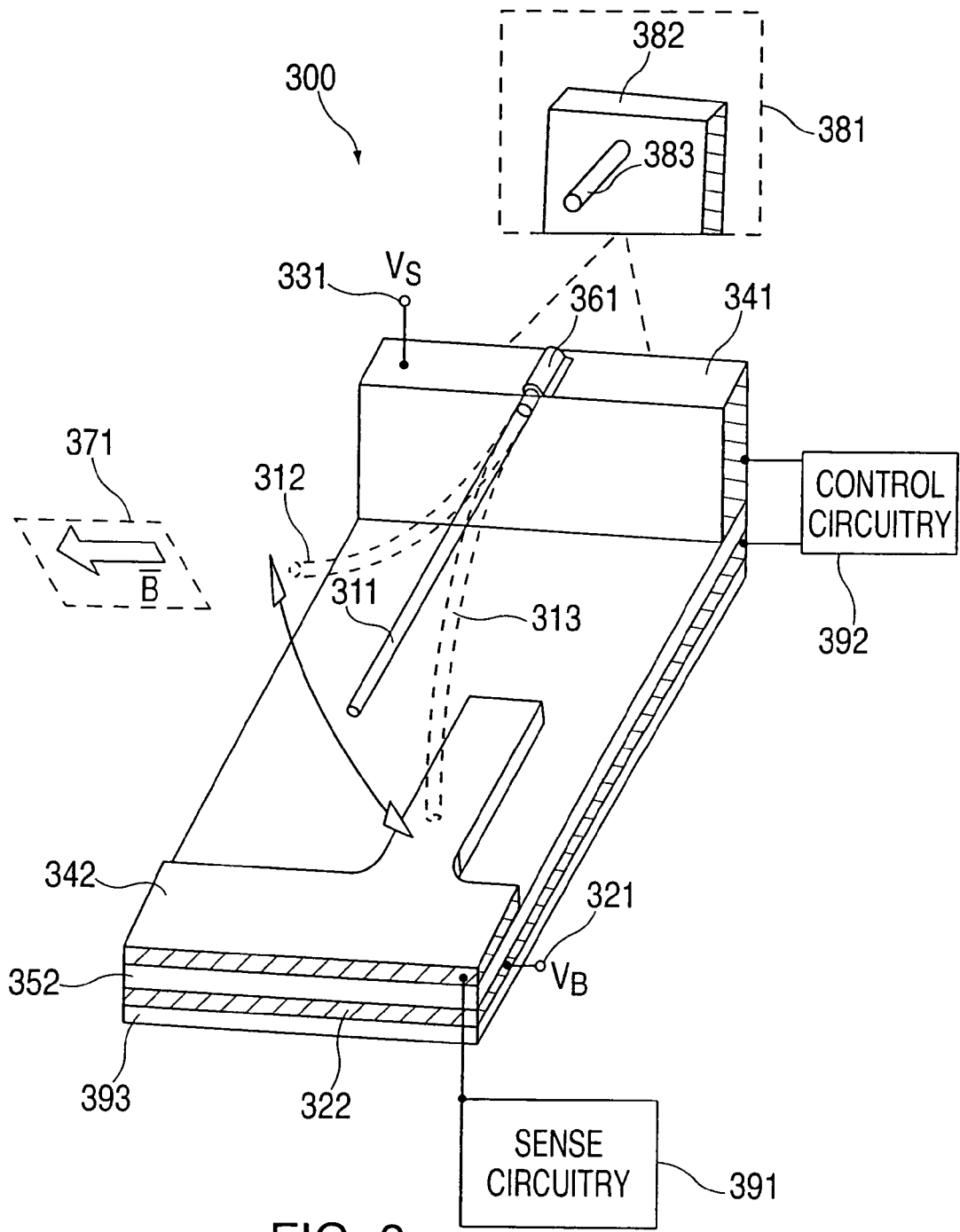
FIG. 3 is a perspective view of one embodiment of a nanometer-scale transistor of FIG. 1.

FIG. 3 shows NEM transistor 300 that is constructed to include nanotube 311 as a switching mechanism. Transistor 300 is similar to NEMS system 100 of FIG. 1 such that the general functionality of the components of NEMS system 100 of FIG. 1 are generally modeled by the components of transistor 300. For example, nanometer-scale beam 100 of FIG. 1 is embodied in transistor 300 as nanotube 311. Base charge member 122 of FIG. 1 is embodied in transistor 300 as charge member layer 322. Furthermore, emitter contact 142 and collector contact 141 of FIG. 1 are embodied in transistor 300 as emitter contact layer 342 and collector contact layer 341, respectively.

Nanotube 311 may be said to be in a closed position (e.g., position 313) when nanotube 311 electrically couples collector contact layer 341 to emitter contact layer 342. Persons skilled in the art will appreciate that nanotube 311 may have electrical interactions with emitter contact layer 342 even when nanotube 311 is close to, but not physically touching, emitter contact layer 342. Nanotube 311 may be said to be in an open position when nanotube 311 does not electrically couple collector contact layer 341 to emitter contact layer 342 (e.g., position 312).

Preferably, nanotube 311 is in a closed position when the negative charge at charge member 322 is high enough to attract the positively charged nanotube 311 toward charge member layer 322 to a point where collector contact layer 341 electrically couples to emitter terminal 342. Persons skilled in the art will appreciate that the charge of nanotube 311 is affected by the voltage of collector contact layer 341 to an extent where changing the voltage applied to collector contact layer 341 causes nanotube 311 to electrically couple with emitter contact layer 342. Thus, both the values of the voltages applied to charge member layer 322 and collector contact layer 341 need to be considered when designing transistor 300 to meet specific switching characteristics. Isolation layer 352 is provided such that the voltage on charge member 322 does not leak into emitter contact layer 342.

Persons skilled in the art will appreciate that the voltage applied to charge member layer 322 (the base or gate terminal of transistor 300) does not have to be a DC voltage. In this manner, an AC voltage source may be utilized to supply voltage to charge member layer 322 and control the operation of transistor 300.

Additionally, one end of nanotube 311 may be attached to collector contact layer 341 by nanotube retainer member 361. Variably, nanotube 311 may be grown onto collector contact layer 341 as shown in optional configuration 381 in which nanotube 383 is selectively grown onto conductive layer 382. In optional configuration 381, nanotube 383 is preferably self-attached to conductive layer 382.

Persons skilled in the art will appreciate that NEM transistor 300 may be manipulated by external magnetic field (B) 371. Introducing a magnetic field upon transistor 300 may cause, for example, nanotube 311 to remain in a closed position when current is flowing from collector contact 341 to emitter contact 342. Persons skilled in the art will appreciate that motion of nanotube 311 in the presence of magnetic field 371 induces an electric field along the length of nanotube 311. This electric field affects current flow through nanotube 311 when nanotube 311 is in motion. In this manner, magnetic field (B) 371 introduces a gain factor to transistor 300.

Persons skilled in the art will appreciate that in creating a temporary bond between nanotube 311 and emitter contact layer 342 by magnetic field 371 that NEM transistor 300 performs more like a traditional MOSFET. Without magnetic field 371, or a different bonding instrument, nanotube 311 will generally contact emitter contact layer 342 intermittently and at a rate dependent upon the intensity of the electric field created by charge member layer 322, the temperature of nanotube 311, and other factors of transistor 300. As mentioned, this contact rate, or contact frequency, can be utilized to realize the functionality of a PPM and an analog-to-digital converter. Persons skilled in the art will appreciate that by including a bonding instrument to transistor 311 (e.g., magnetic field 371 created by a magnetic field generator), transistor 300 may be utilized as a traditional MOSFET in that if a continuous electric field is supplied by charge member layer 322, a continuous output will preferably be supplied at emitter contact layer 342.

Persons skilled in the art will appreciate that the Lorentz forces about nanotube 311, when current is flowing through nanotube 311, may be strong enough to keep nanotube 311 in position 313 even after an appropriate attracting voltage source is removed from terminal 321. As mentioned above, nanotube 311 may be made to "pop off" (e.g., return substantially to a resting location) of emitter contact layer 342. Reiterating, such procedures could involve, for example, reversing the polarity of the electric field created by charge member layer 322 or removing/reducing magnetic field 371 from transistor 300. However, designs can be fabricated to configure nanotube 311 such that nanotube 311 naturally "pops off" emitter contact layer 342. For example, nanotube 311 may be placed a particular distance above emitter contact layer 342 such that when an appropriate attracting electric field is removed from emitter contact layer 322, the elasticity and spring constant of nanotube 311 naturally overcomes the Lorentz forces created by magnetic field 371. Additionally, emitter contact layer 342 may actually be the collector of transistor 300 while collector terminal 341 has the functionality of an emitter terminal.

Transistor 300 may utilize system or device characteristics to boost weak signals. As per one example, the voltage applied to charge member layer 322 may be adjusted so that a known number of contacts occur between nanotube 311 and emitter terminal 342 when no signal is present at collector terminal 341 except for the Johnson noise of the circuit. A weak signal may then be superimposed on this thermal voltage that will produce a measurable increase in the number of contacts per unit of time between nanotube 311 and emitter terminal 342. The Johnson noise of the circuit may then be averaged out of the signal, leaving only the weak signal. Particularly, an array of nanotube 311 amplifiers configured in parallel with a common base would average out the Johnson noise of the signal. As a result, weak signals can be detected and transistor 300 may be employed as an amplifier.

Stated another way, a weak signal can be applied to charge member layer 322. A relatively HIGH voltage source (e.g., 3 volts) may be applied to collector contact layer 341 such that when nanotube 311 couples to emitter contact layer 342 in response to weak signals applied to charge member layer 322, the voltage of collector terminal 341 will be applied to emitter terminal 342. If emitter contact layer 342 is the output signal of the amplification operation of transistor 300, than the amplification gain would be approximately equal to $V_{341}/V_{322}$ when nanotube 311 is in a closed position. The voltage values at emitter contact layer 341 may than be averaged together over a period of time so that different input signals applied to charge member 322 may be distinguished by the number of times a closed circuit is formed (because a higher voltage at charge member layer 322 will result in more closed circuit instances over a set period of time). Persons skilled in the art will appreciate that, in the above amplification method, the linearity between the number of closed circuit contacts and the magnitude of the input signal applied to charge member layer 322 is important if the amplified signals at emitter contact layer 342 are to be representative of the input signals. Alternatively, a charge may be placed on charge member layer 322 and weak signals may be detected at collector contact layer 341. Persons skilled in the art will appreciate that nanotubes may be employed as contact layers (for example in place of contact layer 342) of NEM transistor 300 in order to improve the wear characteristics of NEM transistor 300.

Additionally, the greater the number of closed circuits that occur in NEM transistor 300 over a set period of time, the larger the average voltage of emitter contact layer 342 will be for a set voltage at collector contact layer 341. Thus, the average voltage of emitter contact layer 342 over a period of time can be utilized to be representative of the weak input signals applied to charge member layer 322. The maximum amplified output voltage of such a design would be roughly equivalent to the voltage applied to collector contact layer 341. Alternatively, the number of contacts (e.g. the rate or frequency of contacts) can be measured and utilized to determine the input signals applied to charge member layer 322.

Transistor 300 may also be employed as an adjustable diode. In this embodiment, magnetic field (B) 371 is required. If voltage source 331 is a voltage signal with an alternating polarity and the voltage supplied to charge member layer 322 is held constant, transistor 300 will only allow current to flow when nanotube 311 is at a certain polarity. Once current is flowing in a certain direction through nanotube 311, magnetic field 371 will create a Lorentz force that holds the current conducting nanotube 311 in a closed position (e.g., nanotube 311 will be coupled to emitter contact layer 342). Now, when the polarity of the current through nanotube 311 reverses, magnetic field 371, in conjunction with reversed current of nanotube 311, will cause nanotube 311 to be in an open position (e.g. nanotube 311 will not be electrically coupled to emitter terminal 342). As a result, a diode functionality is realized. More specifically, a half-wave rectifier is realized in transistor 300. Persons skilled in the art will appreciate that the half-wave rectifier functionality of transistor 300 may be utilized to create a full-wave rectifier as well as various other diode circuits.

When transistor 300 is employed as a diode, the forward voltage drop of the diode may be lower than a conventional diode. This is because the forward voltage drop of a diode constructed from transistor 300 is approximately equal to the contact resistance between nanotube 311 and emitter contact layer 342 and the resistance of nanotube 311. A diode constructed from transistor 300 also has an extremely high efficiency because the diode is either in an ON or OFF state. Persons skilled in the art will appreciate that the forward voltage drop of transistor 300 can be reduced by placing multiple instances of transistors 300 in a parallel configuration. A diode realized by transistor 300 may be an adjustable diode in that the polarity of the diode may be changed by reversing the polarity of charge member layer 322 and magnetic field 371. Furthermore, the minimum required voltage of source voltage 331 may be adjusted by changing base voltage 321 to control the flow of current through nanotube 311. Similarly, magnetic field 371 may be adjusted.

As discussed above, the contact frequency of nanotube 311 with emitter contact layer 342 may be, for example, any thermally induced contact frequency modulated by the magnitude of the charge density on charge member 322 and nanotube 311. Yet, this contact frequency may be modulated by different means and mechanisms. For example, the contact frequency may be modulated optically. For example, light from a light emitting diode (LED), laser, or the sun may be focused on nanotube 311. By adjusting the light intensity impinging nanotube 311, current through nanotube 311 will increase, or decrease, for a given voltage applied to collector contact layer 341 because the light bends nanotube 311 toward, or away from, emitter contact 342. If the source of light is directed at nanotube 311 at a certain angle, current through nanotube 311 will increase because the amount of times that nanotube 311 couples to emitter terminal 341 will increase as light intensity incident to nanotube 311 increases.

Persons skilled in the art will appreciate that if charge member layer 322 remains negatively charged and the voltage of collector contact layer 341 produces a negative charge on nanotube 311 than nanotube 311 preferably will never, or at least rarely, contact emitter terminal 342. In this manner, if the charges between nanotube 311 and charge member layer 322 are the same (e.g., both are negative or positive) than nanotube 311 will repel from charge member layer 322. If the polarities of the charge profiles of nanotube 311 and charge member layer 322 are opposite then nanotube 311 will preferably be attracted to charge member layer 322. Thus, nanotube 311 may either have a negative or positive charge and still achieve the operation of a transistor.

Persons skilled in the art will appreciate that the contact layers of transistor 300 are preferably fabricated from a conductive material such as a metal layer. To minimize wear, however, these contact layers may also include, for example, stationary nanotubes. Persons skilled in the art will also appreciate that the isolation layers of transistor 300 are preferably fabricated from a non-conductive material such as an oxide layer.

Base 393 may be included in transistor 393 in order to provide a structure on which the rest of the components of transistor 300 may be, for example, grown, laid, sputtered, etched, or placed. Base 393 may be, for example, a layer of silicon. Generally, a mounting assembly fixes a portion of nanotube 311 to base 393. This mounting assembly may include multiple components of transistor 300 as well as components not shown in transistor 300. For example, the mounting assembly may include contact layer 341 and isolation layer 352. Alternatively, isolation layer 352 may extend from base 393 and form the mounting assembly or contact layer 341 may fix nanotube 311 directly to base 393. Thus, the mounting assembly can take on numerous forms while still retaining the principle of fixing a portion of nanotube 311 such that the fixed portion only moves with respect to movement of base 393.

Sense circuitry 391 may be provided to sense electrical signals at contact 342. Sense circuitry 391 may, for example, determine the rate of contact between nanotube 311 and contact 342. Control circuitry 392 may be provided to provide electrical signals to charge member layer 322 or contact 341. For example, control circuitry 392 may selectively provide voltage source 331 to contact 341 and voltage source 321 to charge member layer 322. Control circuitry 392 may also control the polarity and intensity of any provided signals. Persons skilled in the art will appreciate that control circuitry 392 and sense circuitry 391 may be coupled to other components of transistor 300. For example, sense circuitry 391 may be coupled to contact 341 to sense electrical signals at contact 341 while control circuitry 392 may be coupled to contact 342 to provide electrical signals to contact 342. Such a configuration may used, for example, when light is used to change the contact rate between nanotube 311 and contact 342. When light is used to change the contact rate, charge member layer 322 is not needed. Moreover, charge member layer 322 may not be needed in a diode implementation. For example, if a large enough charge was applied to contact 342 then an oppositely charged nanotube 311 may electrically couple to contact 342 without the electrostatic forces supplied by charge member layer 322. In this diode embodiment, the turn-ON voltage would be roughly equivalent to the voltage needed to electrically couple nanotube 311 with contact 342.

Figure 4:
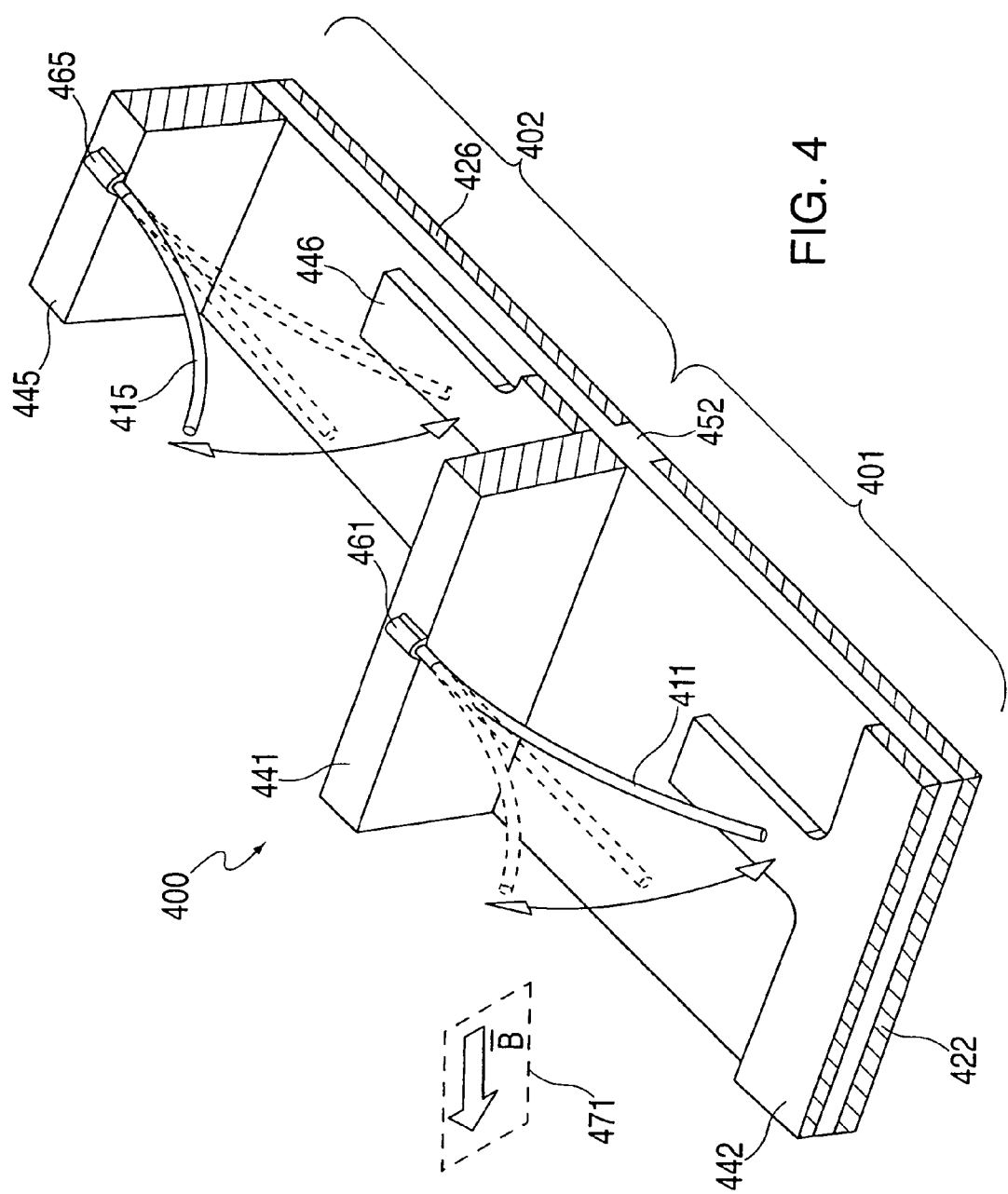
FIG. 4 is another perspective view of one embodiment of a nanometer-scale transistor of FIG. 1.

FIG. 4 depicts transistor array 400 that includes two transistors, transistors 401 and 402, constructed in a series configuration. In realizing the series configuration, emitter contact layer 446 of transistor 402 is coupled to collector contact layer 441 of the transistor 401.

Persons skilled in the art will appreciate that the base terminals of transistors 401 and 402 are defined by separate charge member layers 422 and 426, respectively. Charge members 422 and 426 are isolated from each other by isolation layers 452. Thus, transistors 401 and 402 can be controlled separately. Nanotubes 411 and 415 are preferably attached to collector contact layers 441 and 445, respectively.

A signal applied to transistor array 400 will only pass from collector contact layer 445 of transistor 402 to emitter contact layer 442 if the charge on charge member layers 422 and 426 are both of the appropriate magnitude and type to attract nanotubes 411 and 415 to emitter contact layers 442 and 446, respectively. In this manner, transistors constructed in accordance with the principles of the present invention may employed as logic components. For example, transistor array 400 may be viewed as a logical AND gate in that both charge members 422 and 426 have to close transistors 401 and 402, respectively, if a signal is to pass from collector terminal 445 to emitter terminal 442.

Magnetic field 471 may be included in transistor array 400 to create Lorentz forces on transistors 401 and 402 that are in a closed position (e.g., nanotubes 411 and 415 are electrically coupled to emitter contact layers 442 and 446, respectively). As described above, the Lorentz force created by magnetic field 471 will preferably keep transistors 401 and 402 closed as long as current of one polarity is flowing through nanotubes 411 and 415, respectively. Persons skilled in the art will appreciate that magnetic field 471 may be two independent magnetic fields. In such an embodiment, a separate magnetic field may be utilized in transistors 401 and 402.

Figure 5:
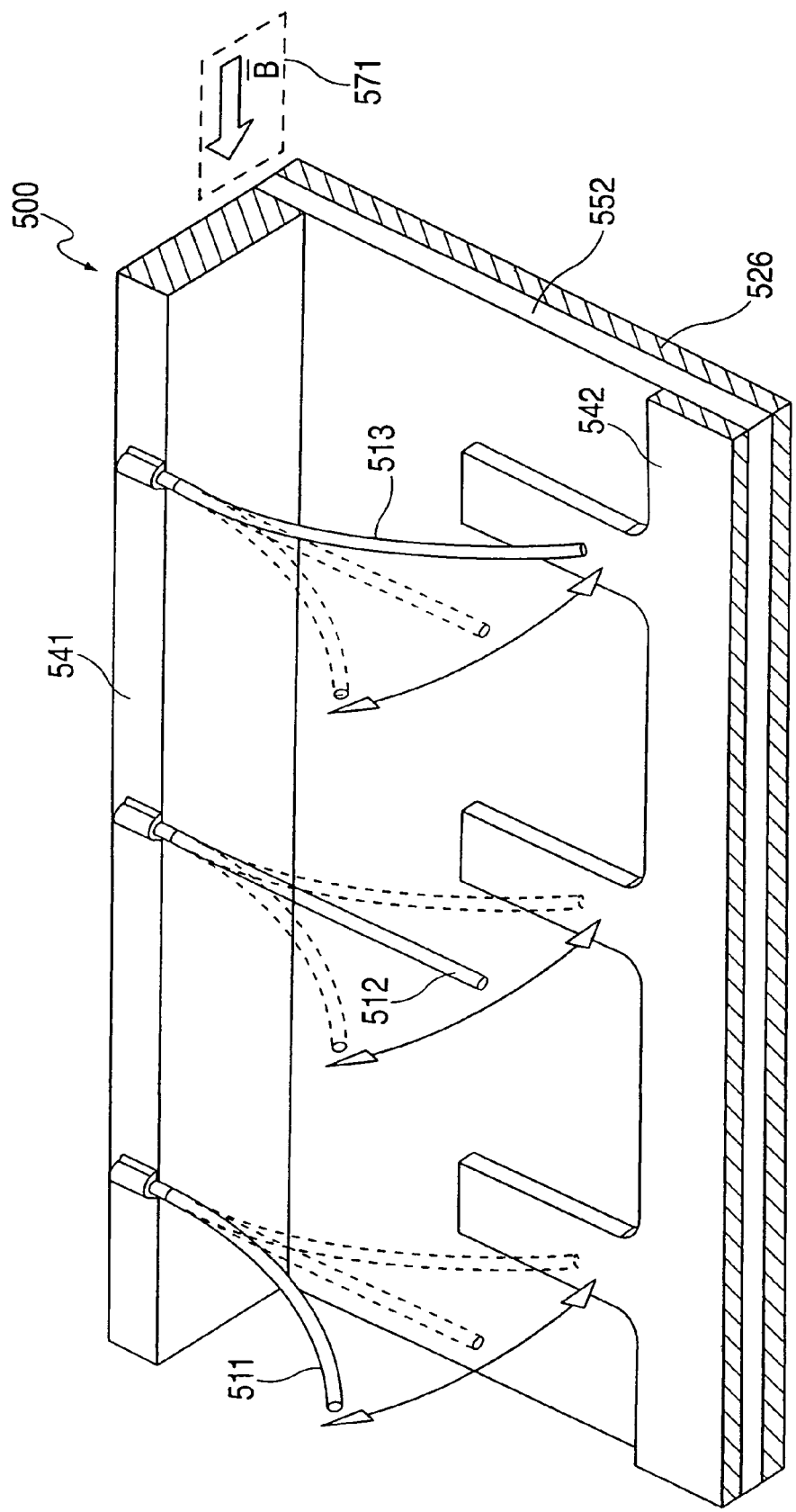
FIG. 5 is yet another perspective view of one embodiment of a nanometer-scale transistor of FIG. 1.

Turning now to FIG. 5, transistor array 500 is shown that includes three transistors constructed in a parallel configuration. More particularly, the transistors defined by nanotubes 511–513 are coupled at one end to common collector contact layer 541. The free-moving ends of nanotubes 511–513 may, depending on the state of the transistors of transistor array 500, couple to common emitter contact layer 542. Thus, the transistors of transistor array 500 share the same collector terminal (e.g., collector contact layer 541) and emitter terminal (e.g., emitter contact layer 542). The transistors of transistor array 500 also share a common base terminal at charge member layer 526 that is isolated by isolation layer 552.

As a result of the configuration of the transistors of transistor array 500, persons skilled in the art will appreciate that transistor array 500 may be employed as a single transistor. Furthermore, adding additional nanotubes to transistor array 500 in a common-base parallel configuration increases the stability of the single transistor modeled by transistor array 500. In other words, adding nanotubes to transistor array 500 increases the frequency at which at least one of the nanotubes of transistor array 500 creates an electrical connection between common collector contact layer 541 and common emitter contact layer 542 for any given voltage applied to common charge member layer 526. In addition to increasing transistor stability, transistor array 500 has other advantages. For example, minute differences in the signals supplied to charge member layer 526 result in a more distinguished output signal at common emitter contact layer 542. When transistor array 500 is employed as an amplifier, this attribute provides better linearity.

Each nanotube of transistor array 500 may have a significant internal resistance (e.g., 1,000–10,000 ohms). However, if nanotubes 511–513 electrically contact emitter contact layer 542 at the same time then the internal resistance that will be seen in these three parallel nanotubes will be approximately equivalent to ⅓ of the resistance of an individual nanotube 511–513. One embodiment of array 500 may contain thousands of, or even billions of, nanotubes in a parallel configuration. Thus, the minimum ON resistance of such an array can be very low while keeping the linearity of the array very high. In this manner, transistor array 500 is similar to a linear transistor in that transistor array 500 may be utilized as a variable resistor.

Persons skilled in the art will also appreciate that isolation layer 552 may be fabricated such that each of nanotubes 511–513 has a separate charge member 526. As a result, an independent-base parallel configuration is realized that may be useful in many applications. For example, transistor arrays 500 in an independent-base parallel configuration, depending on how charge members 526 and nanotubes 511–513 are charged, may be employed as an "OR" logic circuit. In this manner, transistors in an independent-base series configuration (e.g. transistor array 300 of FIG. 3), depending on how charge members 526 and nanotubes 511–513 are charged, may be used as an "AND" logic circuit.

Figure 6:
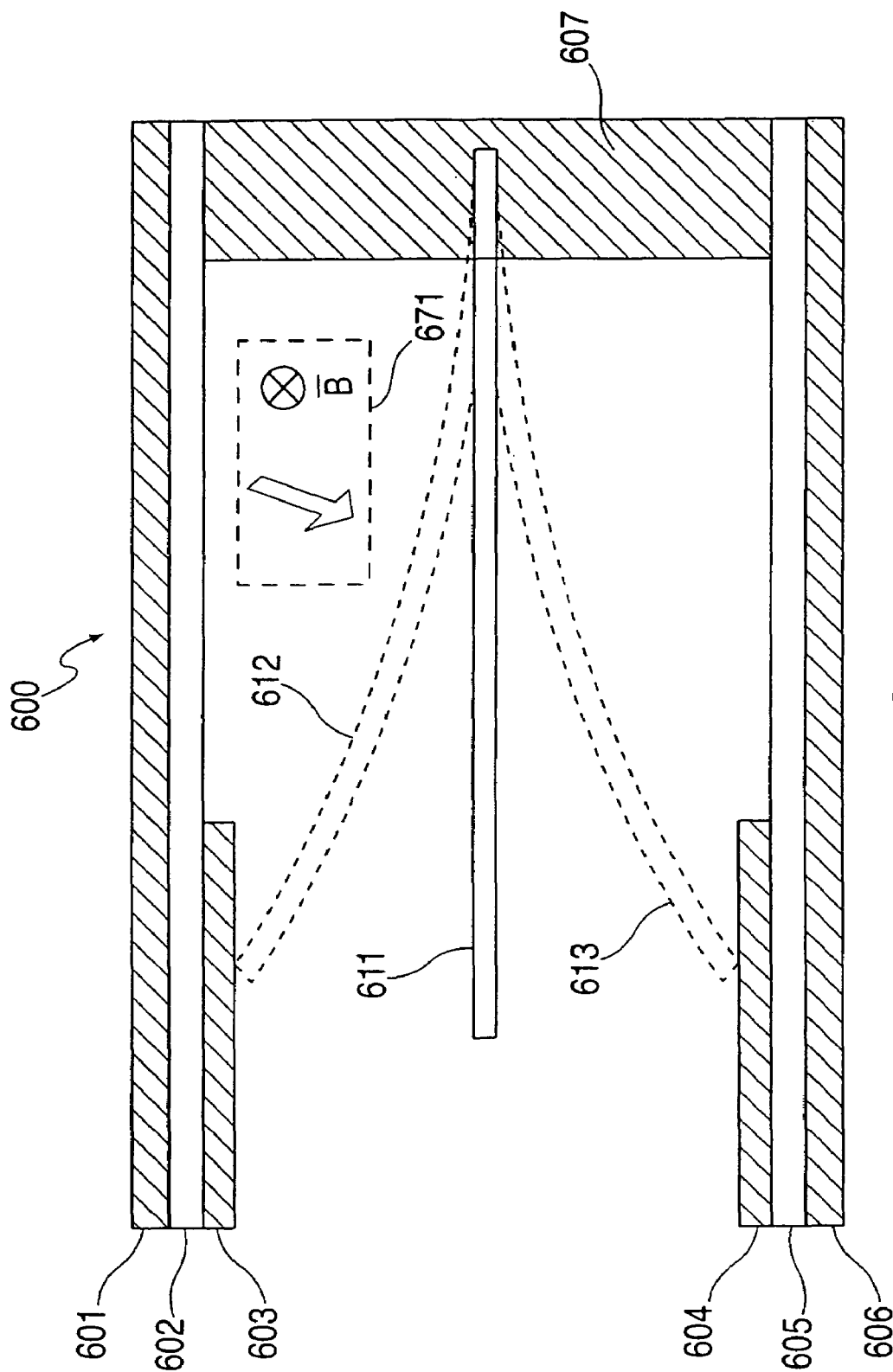
FIG. 6 is a perspective view of a nanometer-scale dual-gate transistor constructed in accordance with the principles of the present invention.

FIG. 6 depicts NEM assembly 600 that utilizes two charge members, charge member layers 601 and 606, to control and position nanotube 611. Charge member layers 601 and 606 can be utilized in many ways to give NEM assembly 600 many different functionalities.

In one embodiment, for example, charge member layers 601 and 606 may be positioned on opposite sides of nanotube 611. Furthermore, charge member layers 601 may also impose, at all times, an opposite charge on nanotube 611. As a result of this embodiment, the stability of NEM assembly 600 increases when it is employed as a transistor. This is because as one of the charge members is "repelling" nanotube 611, the opposite charge member layer is "attracting" nanotube 611. As a result, the frequency of nanotube 611 contacts increases. Furthermore, if emitter contacts 603 and 604 are coupled together, the number of contacts per unit of time increases (even if, for example, charge member layer 601 is removed from transistor 600). One application where an increase in the number of contacts would be useful would be in amplification such that weak signals could be more easily distinguished from each other.

As per another embodiment, charge member layers 601 and 606 are similarly placed on opposite sides of nanotube 611. However, in this embodiment, only one of charge member layers 601 and 606 is charged at any given time. As a result, this embodiment can be utilized as a transistor to provide the same logic as two transistors constructed to have a common collector contact layer (e.g., layer 607) with separate emitter contact layers (e.g., layers 603 and 604). Isolation layers 602 and 605 may also be included in NEM assembly 600. Persons skilled in the art will appreciate that this embodiment can easily be reconstructed to have a common emitter layer with separate collector layers such that emitter contact layer 603 would be coupled to emitter contact layer 604 and a small isolation region would split collector contact layer 607 into two portions about nanotube 607.

Persons skilled in the art will appreciate that additional charge members may be included in NEM assembly 600 in order to increase control of nanotube 611. For example, if charge member layer 601 is considered to be above nanotube 611 and charge member layer 606 is considered to be below nanotube 611, charge member layers may also be placed behind and in front of nanotube 611. Surrounding nanotube 611 with additional charge member layers allows the position of nanotube 611 to be controlled in a three dimensional environment. Applications such as NEM and MEM robotic components (e.g., propulsion and motor components), sensors, and switches may all benefit from such an embodiment. Furthermore, additional electrical contacts may be placed about this three dimensional environment, thus providing nanotube 611 with complex switching capabilities. As in all embodiments of the present invention, one or more magnetic fields 671 may be utilized to control and manipulate NEM assembly 600.

Figure 7:
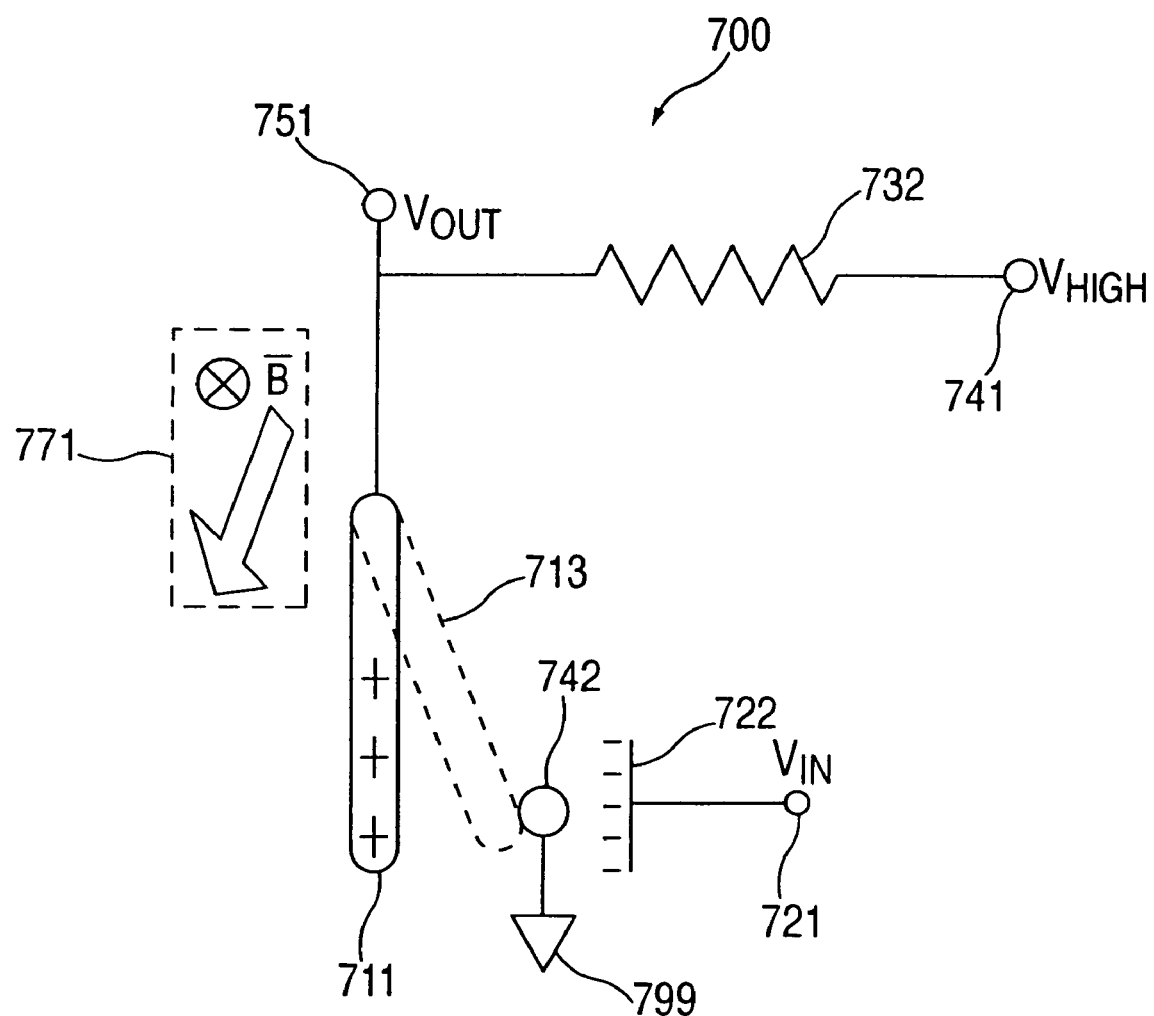
FIG. 7 is a circuit schematic of a nanometer-scale inverter constructed in accordance with the principles of the present invention.

The principles of the present invention may be utilized to construct memory components (e.g., memory latches) from nanotube-based inverters. An example of a nanotube-based inverter is inverter 700 of FIG. 7.

In inverter 700, a system HIGH supply (e.g., 3 volts) voltage is provided to contact 741 while a system LOW (e.g., ground 799) supply voltage is provided at contact 742. Generally, inverter 700 has an output signal at output contact 751. This output signal is an inverted signal of the input voltage applied at input contact 721. Thus, if a system HIGH supply voltage is applied to input contact 721 then a system LOW supply voltage is applied to output contact 751. Similarly, if a system LOW supply voltage is applied to input contact 721 then a system HIGH supply voltage is applied to output contact 751. By creating an inverter, the basic building block of not only memory components, but also logic circuits are realized.

Inverter 700 operates as follows when a HIGH signal is provided by input voltage source 721. Nanometer-scale beam 711 preferably has a charge of a particular polarity respective to the polarity of the voltage supplied at node 741. For example, nanometer-scale beam 711 may have a positive charge. Thus, when a HIGH negative charge is applied to charge member 722 by input voltage source 721, charge member 722 attracts nanometer-scale beam 711 into a position where nanometer-scale beam 711 couples LOW contact 742 (e.g., position 713). Contact 742 is preferably coupled to ground 799. Therefore, a ground signal (e.g., a LOW signal) will be applied to output contact 751 when HIGH voltages are applied to input contact 721. Persons skilled in the art will appreciate that the voltage difference across resistor 732 is equivalent to $V_{741}-V_{799}$ when nanotube 711 is electrically coupled to contact 742 (ignoring the internal resistance of nanometer-scale beam 711).

Inverter 700 operates as follows when a LOW signal (e.g., zero volts) is provided by input voltage source 721. Charge member 722 does not attract nanometer-scale beam 711 into a position where nanometer-scale beam 711 couples LOW contact 742 (e.g., position 713) because the LOW signal applied to charge member 722 does not attract nanotube 711 to contact 742. As a result, there is no voltage difference across resistor 732 and the voltage applied to HIGH voltage contact 741 will be applied to output contact 751. Persons skilled in the art will appreciate that a HIGH charge, or any charge, of the same type as the charge of nanotube 711 will also preferably provide a HIGH output at output node 751 because nanotube 711 will be repelled from contact 742. For the same reasons that magnetic field 371 of FIG. 3 is included in transistor 300 of FIG. 3, magnetic field 771 may also be included in inverter 700.

Figure 8:
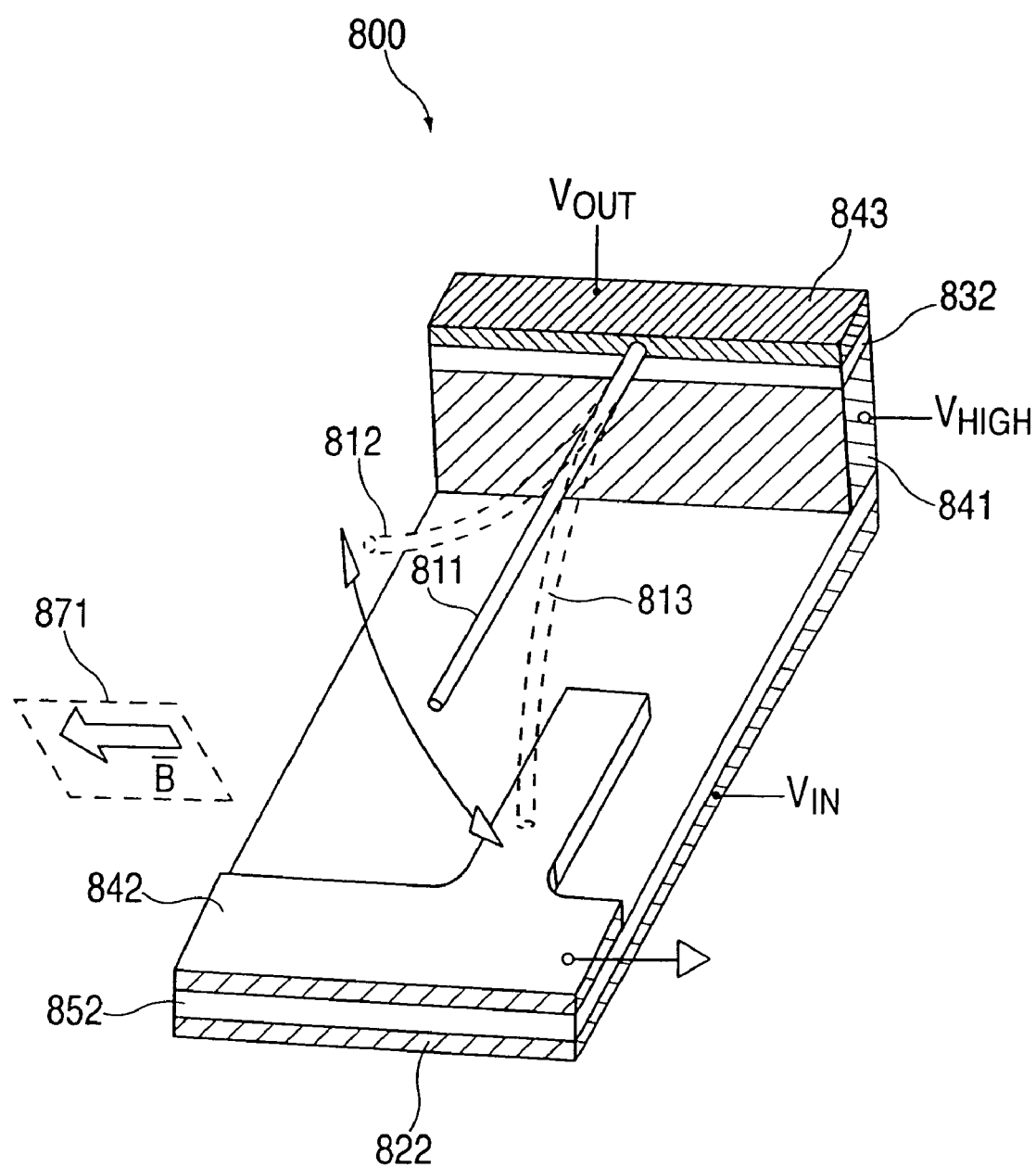
FIG. 8 is a perspective view of one embodiment of a nanometer-scale inverter of FIG. 7.

FIG. 8 illustrates inverter 800 that includes nanotube 811 as a nanometer-scale beam. The operation of inverter 800 is similar to the operation of inverter 700 of FIG. 7. From a structural perspective, nanotube 811 is coupled to output contact layer 843. Output contact layer 843 is separated by voltage source contact layer 841 by resistive layer 832. Contact layer 842 is isolated from charge member layer 822 by isolation layer 852. Generally, contact layer 842 is electrically coupled to nanotube 811 when the voltage supplied to charge member layer 822 attracts nanotube 811 into position 813.

Inverter 800 is preferably configured such that contact layer 842 is coupled to a LOW voltage signal (e.g., ground) and power contact layer 841 is coupled to a HIGH voltage signal (e.g., 3 volts). In doing so, inverter 700 will have an output voltage at output contact layer 843 approximately equivalent to ground when the input voltage applied to charge member layer 822 is HIGH, thus attracting nanotube 811 into position 813. When the input voltage applied to charge member layer 822 is LOW (e.g., ground) or such that nanotube 811 is repelled to position 812, the output voltage applied to output contact 843 will be approximately the HIGH voltage signal applied to power contact layer 841. For the same reasons that magnetic field 371 of FIG. 3 is included in transistor 300 of FIG. 3, magnetic field 871 may also be included in inverter 800.

FIGS. 9A–9H are sectional views of process steps used to fabricate a nanometer-scale electrical-mechanical system. More particularly, FIGS. 9A–9H show one embodiment of a fabrication process for creating transistor 300 of FIG. 3.

Figure 9A:
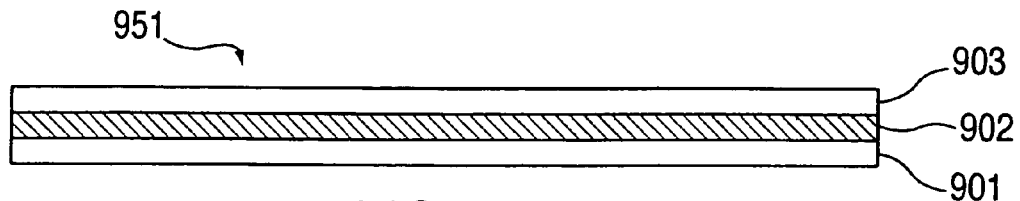
FIGS. 9A–9F are sectional views of process steps used in the fabrication of a nanometer-scale electrical-mechanical system constructed in accordance with the principles of the present invention.

Turning first to FIG. 9A, step 951 is shown in which conducting layer 902 is placed on base layer 901. Conducting layer 902 may be, for example, a metal layer such as an aluminum, tin, copper, or tungsten or a dielectric layer such as a polysilicon. Base layer 901 may be, for example, a semiconductor. Conducting layer 902 may be placed on base layer 901 by, for example, selective disposition, sputter deposition, plasma vapor deposition, or a chemical vapor deposition (CVD). Non-conductive layer 903 may then be placed on top of conductive layer 902. Non-conductive layer 903 may be, for example, an oxide layer or silicon-dioxide. In constructing a transistor in accordance with the principles of the present invention, conductive layer 902 would preferably be a charge member layer while non-conductive layer 903 would preferably be an isolation layer between a charge member layer and emitter contact layer.

Figure 9B:
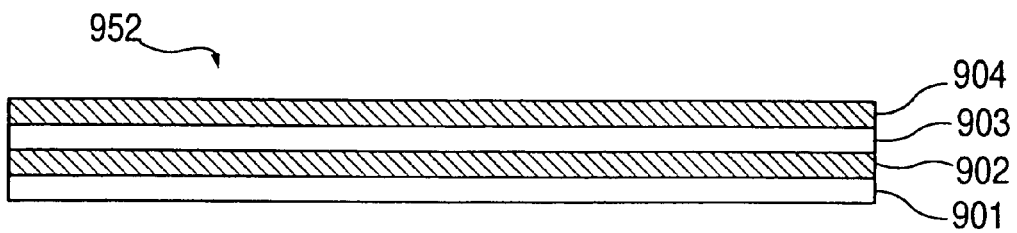

In FIG. 9B conductive layer 904 is placed on non-conductive layer 903 in step 952. Persons skilled in the art will appreciate that conductive layers fabricated in accordance with the principles of the present invention, including conductive layer 903, may be fabricated and laid on a base member by the same method as conductive layer 902. In constructing a transistor in accordance with the principles of the present invention, conductive layer 904 would preferably be an emitter contact layer.

Figure 9C:
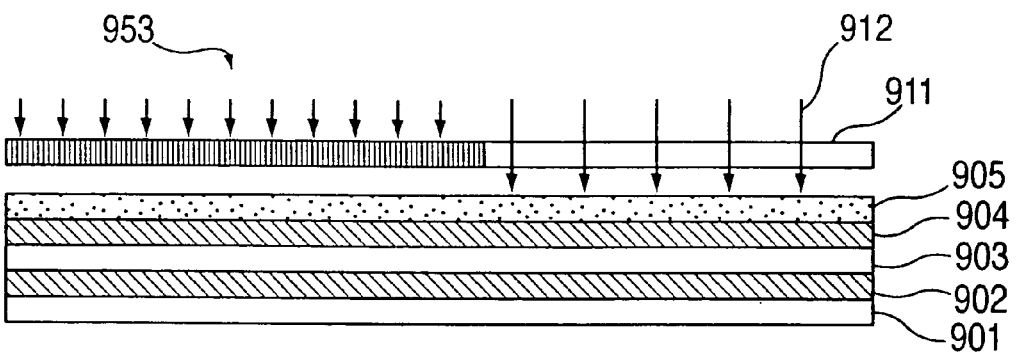
Figure 9D:
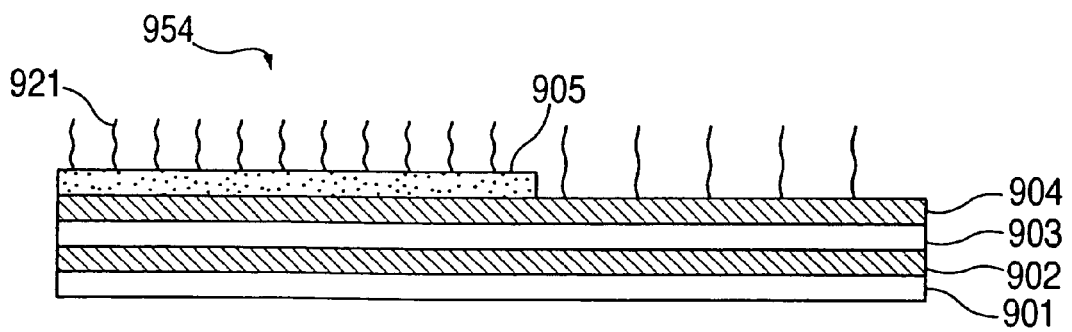

Depending on the application, it may be necessary to shape conductive layer 904. Step 953 of FIG. 9C illustrates initial shaping steps. More particularly, photoresist layer 905 may be deposited on top of conductive layer 904. Light may then be introduced on photoresist layer 905 via mask 911. Mask 911 may be constructed such that light 912 will only pass through specific portions of mask 911 and, as a result, etch respective portions of photoresist 905. As a result of step 953, the structure shown in step 954 of FIG. 9D will be fabricated. Step 954 introduces etching process 921 to conductive layer 904 in the portions not covered by photoresist 905. As a result, conductive layer 904 is shaped as shown in step 955 of FIG. 9E. Remaining photoresist 905 may then be washed or etched away in step 955.

Figure 9E:
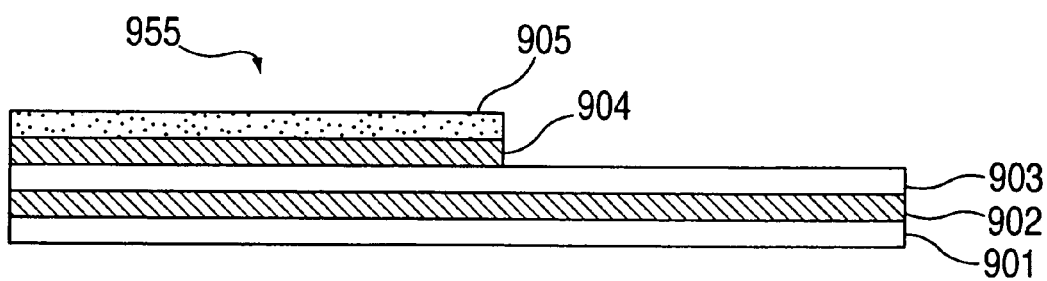
Figure 9F:
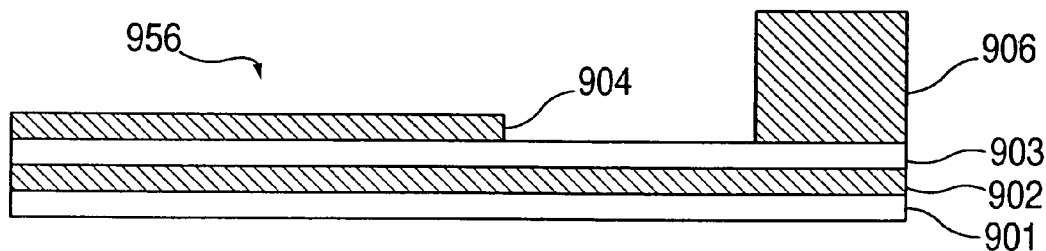

Step 956 of FIG. 9E includes conductive layer 906. In constructing a transistor in accordance with the principles of the present invention, conductive layer 906 may be utilized as a charge member layer. Conductive layer 906 may be formed and shaped with a process similar to the one used on conductive layer 904. Conductive layer 906 may also be formed and shaped with conductive layer 904 during steps 953–955 of FIGS. 9C–9E.

Figure 9G:
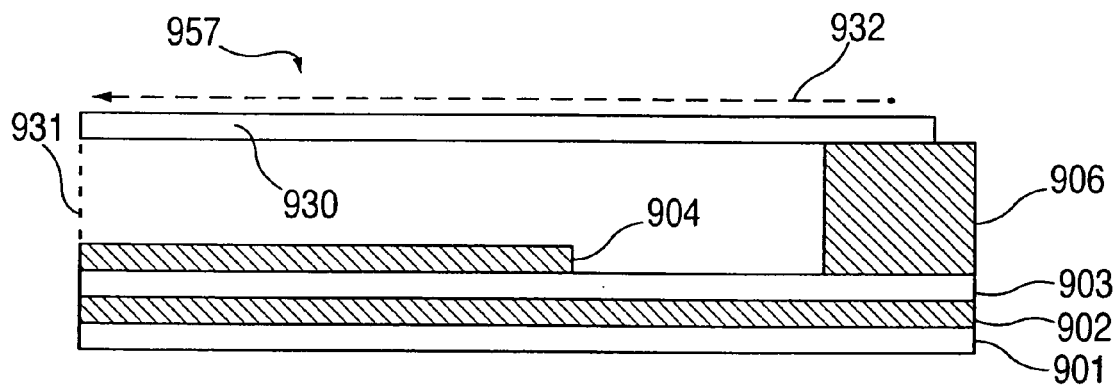

Nanotube 930 may then be placed on conductive layer 906 as illustrated in step 957 of FIG. 9G. In constructing a transistor in accordance with the principles of the present invention, nanotube 930 may be utilized as a beam that electrically couples conductive layer 906 to conductive layer 904 when the appropriate signals are applied to conductive layer 902 and nanotube 930.

Nanotube 930 may be placed on conductive layer 906 by many different means. For example, a support layer may be provided in area 931. Nanotube 930 may then be formed partially on top of support layer 931 and partially on top of conductive layer 906. The portion of nanotube 930 above conductive layer 906 may then be attached by a non-conductive layer (e.g., layer 907 of FIG. 9H). Persons skilled in the art will appreciate that layer 907 may also be a conductive layer. After support layer 931 is removed, nanotube 930 is free to move except for the portion of nanotube 930 anchored to conductive layer 906.

As per another example, Nanotube 930 may be grown outward from conductive layer 906 as shown by growth arrow 957. Persons skilled in the art will appreciate that during growth, the portion of nanotube 930 located over conductive layer 906 does not have to be anchored by another layer (e.g., layer 907 of FIG. 9H). Instead, nanotube 930 may self-attach to conductive layer 906. In other embodiments, nanotube 930 may be held in place by electro-magnetic fields while it forms.

As per yet another example, Nanotube 930 may be formed outside of step 957, independent from the formation of the nanometer-scale electrical-mechanical system on base 901, and then placed on conductive layer 906. Nanotube 930 may be placed on conductive layer 906 by, for example, electro-magnetic fields. For additional support during nanotube 957 placement, support layer 906 may also be utilized.

Figure 9H:
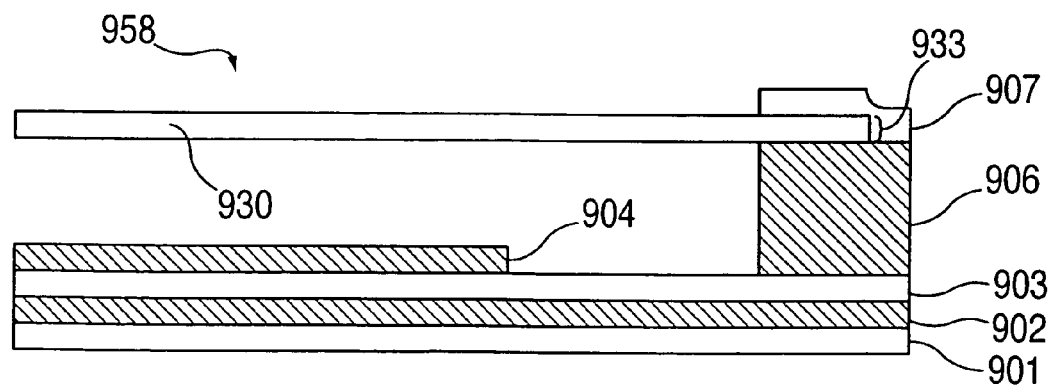

Step 958 of FIG. 9H preferably forms non-conductive layer 907 on top of nanotube 930 and conductive layer 906. As mentioned above, layer 907 may be used to anchor a particular portion of nanotube 930 to conductive layer 906. In constructing a transistor in accordance with the principles of the present invention, the attached end of nanotube 930 is preferably placed partially over conductive layer 906. As a result, non-conducting layer 907 also forms a bond with end portion 933 of nanotube 930. Persons skilled in the art will appreciate that non-conductive layer 933 is not necessary. For example, nanotube 930 may anchored in conductive layer 906. In this embodiment, non-conductive layer 907 is a portion of conductive layer 906.

Figure 10:
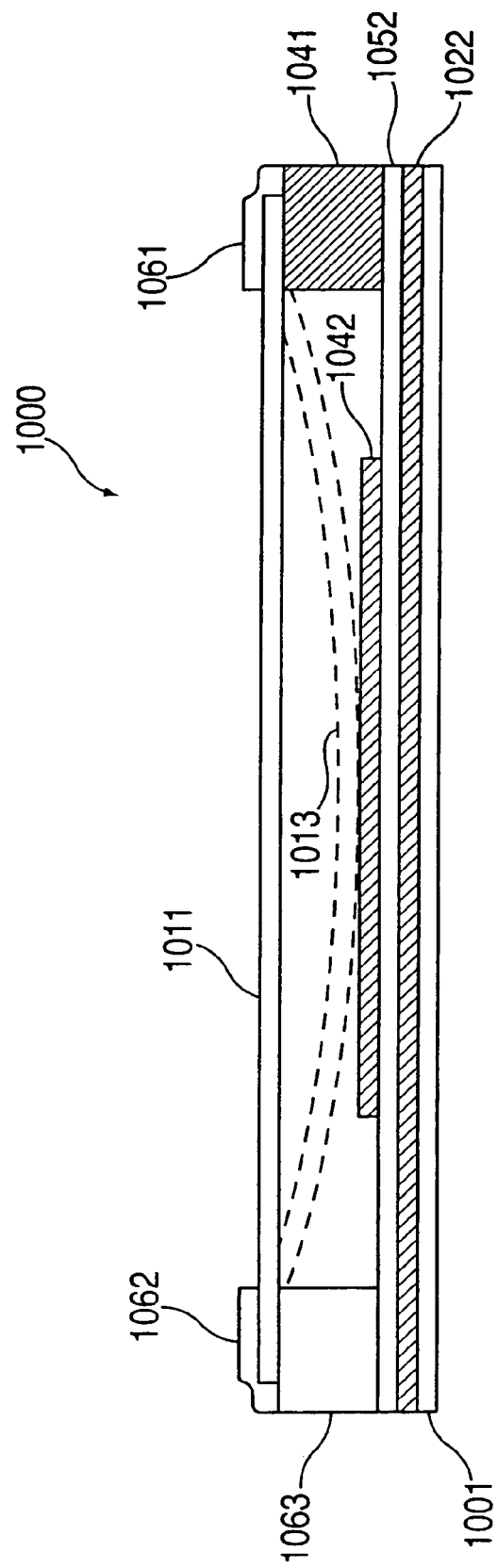
FIG. 10 is a perspective view of one embodiment of a nanometer-scale transistor of FIG. 1.

FIG. 10 shows NEMS system 1000 constructed in accordance with the principles of the present invention. NEMS system 1000 is similar to transistor 300 of FIG. 3 except that nanotube 1011 is anchored at both ends; the free-moving portion of nanotube 1011 is the middle portion of nanotube 1011. In anchoring both ends of nanotube 1011, the stress on any one portion of nanotube 1011 is reduced when compared to nanotube 300 of FIG. 3. Persons skilled in the art, however, will appreciate that nanotube 1011 may be more difficult to bend then a nanotube only anchored at one end.

NEMS system 1000 preferably operates as follows. Nanotube 1011 has a charge of a particular type. When an opposite charge is placed on base member layer 1022, nanotube 1011 is attracted to base member 1022. When the opposite charge on base member layer 1022 is large enough, nanotube 1011 will be manipulated into position 1013 and create an electrical connection between emitter contact layer 1042 and collector contact layer 1041. Nanotube 1011 is anchored at one end by collector contact layer 1041 and retainer 1061. At the opposite end, nanotube 1011 is anchored by non-conductive layer 1063 and retainer 1062. Persons skilled in the art will appreciate that non-conductive layer 1063 or retainer 1062 may be a conductive layer and, as a result, realize additional functionality that may be useful in some applications. NEMS system 1000 may be utilized as other electrical components. For example, NEMS system 1000 may be utilized as a memory cell.

Furthermore, persons skilled in the art will appreciate that nanotube 1011 may be extended beyond retainer 1061 and 1062. Additional charge members and emitter contacts may then be placed underneath these extended areas such that additional functionality may be realized from a single nanotube.

Figure 11:
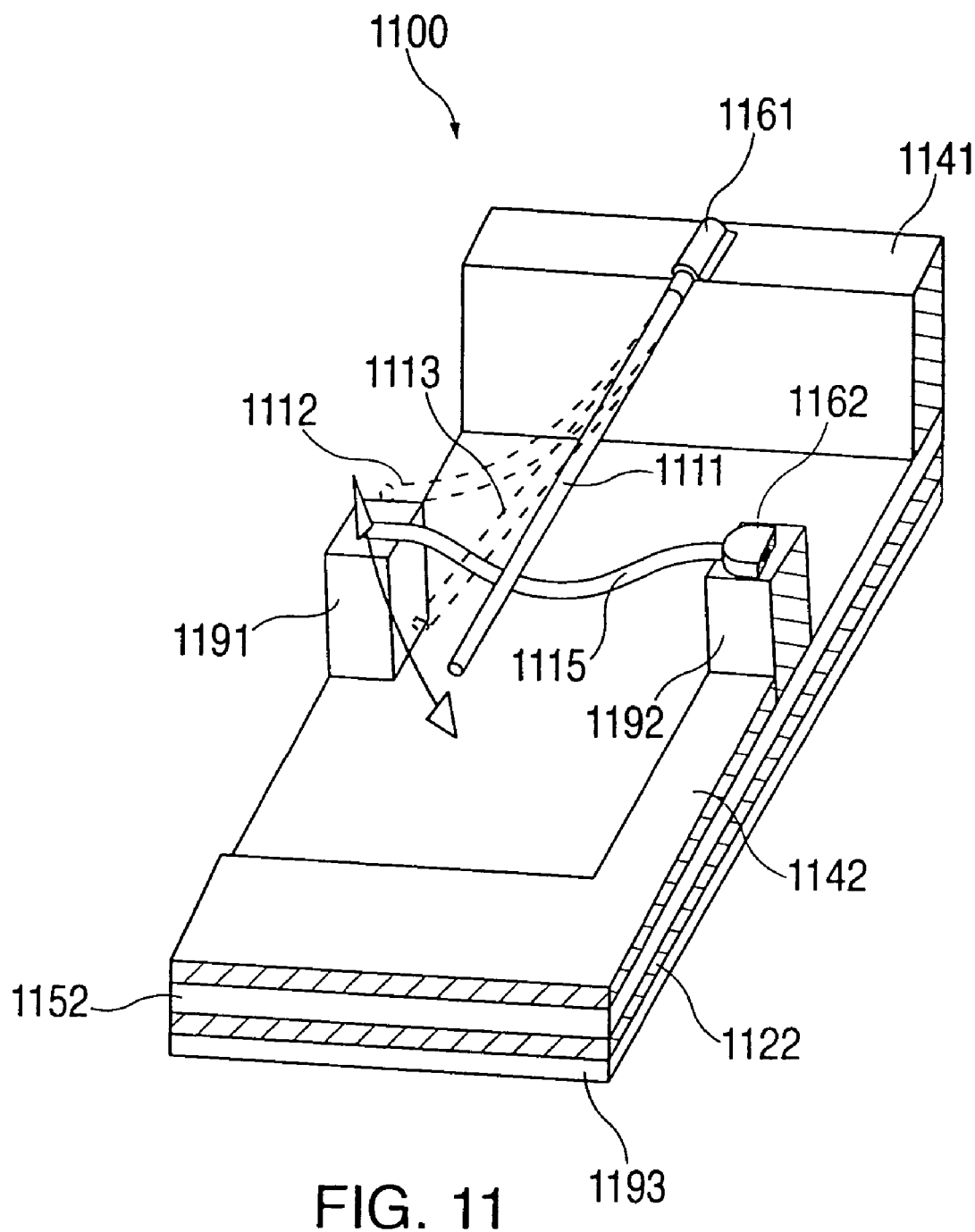
FIG. 11 is a perspective view of one embodiment of a nanometer-scale transistor of FIG. 1.

FIG. 11 shows nanoelectromechanical system 1100 that includes suspended nanotube 1115 as an electrical contact. More particularly, system 1100 is similar to system 300 of FIG. 3 but includes suspended nanotube 1115 as an electrical contact in order to reduce wear to system 1100 that is created by physical impacts from nanotube 1111. In system 300 of FIG. 3, the sense contact is a conductive layer. An impacting nanotube may wear down this conductive layer. Furthermore, if the conductive layer is provided as a non-suspended nanotube then, although the two nanotubes will not wear, energy from the impacting nanotube may be transferred to the other components of system 1100. Thus, any impacting energy may, as a result, wear down the base, other components coupled to the base, or other components coupled to the non-suspended nanotube.

Similar to system 300 of FIG. 3, charges applied to layer 1141 and charge member 1122 may cause nanotube 1111 to move from resting location 1113 (or location 1112) to a position that either physically touches or electrically couples with a sense contact (e.g., nanotube 1115). When physical contacts occur in system 1100, however, nanotube 1115 will bend and, as a result, release energy that may otherwise, if not controlled, create wear in system 1100.

Nanotube 1115 is preferably suspended from mounts 1191 and 1192. Either mount 1191, mount 1192, or both mounts may be conductive and coupled to sense contact 1142. Nanotube 1115 may also be fixed to mounts 1191 and 1192, at both ends, by a restraining member similar to restraining members 1162 and 1161. Persons skilled in the art will appreciate that charge member layer 1122 may also be a charge containment layer that is operable to store a charge. Thus, system 1100 may be used as a memory cell. Such a charge containment layer may, like charge member layer 1122, be isolated from sense contact 1142 by non-conductive layer 1152. Persons skilled in the art will also appreciate that nanotube 1115 is not limited to employment as a nanotube but, more generally, any nanometer-scale beam that is mechanically flexible, electrically conductive, and exhibits good (e.g., LOW) wear characteristics. Persons skilled in the art will appreciate that nanotube 1115 does not have to be fixed to base 1193 at both ends. Instead, nanotube 1115 may be, for example, fixed to base 1193 at only one end.

Persons skilled in the art will appreciate that two components do not have to be connected or coupled together in order for these two components to electrically interact with each other. Thus, persons skilled in the art will appreciate that two components are electrically coupled together, at least for the sake of the present application, when one component electrically affects the other component. Electrical coupling may include, for example, physical connection or coupling between two components such that one component electrically affects the other, capacitive coupling, electromagnetic coupling, free charge flow between two conductors separated by a gap (e.g., vacuum tubes), and inductive coupling.

Additional advantageous nanometer-scale electromechanical assemblies are described in commonly assigned copending U.S. patent application Ser. No. 10/453,199 to Pinkerton et. al, entitled "Nanoelectromechanical Memory Cells and Data Storage Devices," commonly assigned copending U.S. patent application Ser. No. 10/453,326 to Pinkerton et. al, entitled "Electromechanical Assemblies Using Molecular-Scale Electrically Conductive and Mechanically Flexible Beams and Methods For Application of Same," and commonly assigned copending U.S. patent application Ser. No. 10/453,373 to Pinkerton et. al, entitled "Energy Conversion Systems Utilizing Parallel Array of Automatic Switches and Generators," which are all hereby incorporated by reference in their entirely and filed on the same day herewith.

From the foregoing description, persons skilled in the art will recognize that this invention provides nanometer-scale electromechanical assemblies and systems that may be used as transistors, amplifiers, memory cells, automatic switches, diodes, variable resistors, magnetic field sensors, temperature sensors, electric field sensors, and logic components. In addition, persons skilled in the art will appreciate that the various configurations described herein may be combined without departing from the present invention. For example, a magnetic field may be included in the nanometer-scale assembly of FIG. 10. It will also be recognized that the invention may take many forms other than those disclosed in this specification. Accordingly, it is emphasized that the invention is not limited to the disclosed methods, systems and apparatuses, but is intended to include variations to and modifications therefrom which are within the spirit of the following claims.

What is claimed is:

1. A method for operating a nanoelectromechanical transistor comprising:

applying a first charge on a nanometer-scale beam that is fixed to a mounting assembly, said nanometer-scale beam having a first portion that is free to move;

applying a second charge to a conductive charge member layer, that is placed in the proximity of said first free-moving portion such said first and second charges interact with each other; and sensing electrical coupling between said first free-moving portion and a first conductive layer that occurs, at least in part, based on said interaction of said first and second charges; and, wherein the free moving portion and the first conductive layer electrically couple each other multiple times to provide a rate of contact—after 'second charges'.

determining the rate of contact between said first free-moving portion and said first conductive layer.

2. The method of claim 1 wherein said nanometer-scale beam is provided as a nanotube.

3. The method of claim 1 wherein said nanometer-scale beam is provided with a second free-moving portion and said fixed portion is located between said first and second free-moving portions.

4. The method of claim 1 further comprising:
providing a second conductive layer in the proximity of said free-moving portion; and
sensing said first charge on said second conductive layer.

5. The method of claim 1 further comprising:
providing said first charge in a polarity opposite that of the polarity of said second charge.

6. The method of claim 1 further comprising:
providing said first charge in the polarity as the polarity of said second charge.

7. The method of claim 1 further comprising:
adjusting the intensity of said first charge resulting in an increased rate of contact between said nanometer-scale beam and said first conductive layer.

8. The method of claim 1 further comprising:
adjusting the intensity of said second charge resulting in an increased rate of contact between said nanometer-scale beam and said first conductive layer.

9. The method of claim 1 further comprising:
adjusting the rate of contact between said nanometer-scale beam and said first conductive layer by providing light on said nanometer-scale beam.

10. A method for operating a nanoelectromechanical transistor comprising:
applying a first charge on a nanometer-scale beam that is fixed to a mounting assembly, said nanometer-scale beam having a first portion that is free to move;
applying a second charge to a conductive charge member layer that is placed in the proximity of said first free-moving portion such said first and second charges interact with each other; and
causing electrical coupling between said first free-moving portion and a first conductive layer at a first rate of contact based, at least in part, on said interaction of said first and second charges; and
changing at least one of said first and second charges to cause electrical coupling between said first free-moving portion and said first conductive layer at a second rate of contact.

11. The method of claim 10 wherein said nanometer-scale beam is provided as a nanotube.

12. The method of claim 10 wherein said nanometer-scale beam is provided with a second free-moving portion and said fixed portion is located between said first and second free-moving portions.

13. The method of claim 10 further comprising:
providing a second conductive layer in the proximity of said free-moving portion; and
sensing said first charge on said second conductive layer.

14. The method of claim 10 further comprising:
providing said first charge in a polarity opposite that of the polarity of said second charge.

15. The method of claim 10 further comprising:
providing said first charge in the polarity as the polarity of said second charge.

16. The method of claim 10 further comprising:
adjusting the intensity of said first charge resulting in an increased rate of contact between said nanometer-scale beam and said first conductive layer.

17. The method of claim 10 further comprising:
adjusting the intensity of said second charge resulting in an increased rate of contact between said nanometer-scale beam and said first conductive layer.

18. The method of claim 10 further comprising:
adjusting the rate of contact between said nanometer-scale beam and said first conductive layer by providing light on said nanometer-scale beam.

19. The method of claim 10 further comprising:
determining the first rate of contact; and
determining the second rate of contact.

* * * * *